(12) United States Patent
Liu et al.

(10) Patent No.: US 12,311,643 B2
(45) Date of Patent: May 27, 2025

(54) PREFABRICATED SUBSTRATE, FLEXIBLE SUBSTRATE, FLEXIBLE MODULE, FABRICATION METHOD, AND DISPLAY DEVICE

(71) Applicant: Shanghai Tianma Micro-Electronics Co., Ltd., Shanghai (CN)

(72) Inventors: Zhen Liu, Shanghai (CN); Qingsan Zhu, Shanghai (CN); Kerui Xi, Shanghai (CN); Xiaobing Zhao, Wuhan (CN); Huan Li, Shanghai (CN); Fan Xu, Shanghai (CN); Danping Wang, Shanghai (CN); Feng Qin, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 391 days.

(21) Appl. No.: 17/826,823

(22) Filed: May 27, 2022

(65) Prior Publication Data
US 2023/0271397 A1 Aug. 31, 2023

(30) Foreign Application Priority Data
Feb. 28, 2022 (CN) .......................... 202210185640.9

(51) Int. Cl.
| | |
|---|---|
| *B32B 3/04* | (2006.01) |
| *B32B 3/08* | (2006.01) |
| *B32B 7/12* | (2006.01) |
| *H10K 77/10* | (2023.01) |
| *H10K 59/00* | (2023.01) |

(52) U.S. Cl.
CPC .......... *B32B 3/08* (2013.01); *B32B 2457/206* (2013.01); *H10K 59/00* (2023.02); *H10K 77/111* (2023.02)

(58) Field of Classification Search
CPC ....... B32B 3/04; B32B 2457/206; B32B 7/12; H10K 77/111
See application file for complete search history.

(56) References Cited

U.S. PATENT DOCUMENTS

| | | | |
|---|---|---|---|
| 9,935,281 B2 * | 4/2018 | Kim ..................... | H10K 59/874 |
| 11,011,713 B2 * | 5/2021 | Chu ...................... | G09F 9/301 |
| 2019/0377386 A1 * | 12/2019 | Heo ...................... | G06F 1/1637 |

FOREIGN PATENT DOCUMENTS

| | | |
|---|---|---|
| CN | 110534647 A | 12/2019 |
| CN | 110950542 A | 4/2020 |

* cited by examiner

*Primary Examiner* — Joanna Pleszczynska
(74) *Attorney, Agent, or Firm* — Anova Law Group, PLLC

(57) ABSTRACT

A prefabricated substrate, a flexible substrate, a flexible module and a fabrication method, and a display device are provided. The prefabricated substrate includes a first film layer as a rigid film layer, and a second film layer as a flexible film layer. The second film layer at least partially wraps the first film layer. The first film layer includes a first surface and a second surface. The second film layer at least includes a first portion located on a side of the first surface away from the second surface, and a second portion and a third portion located on a side of the second surface away from the first surface. The second portion and the third portion are attached on the second surface through a first adhesive layer and a second adhesive layer, respectively. The second portion and the third portion are spaced apart by a gap.

10 Claims, 16 Drawing Sheets

Providing the prefabricated substrate 00, where the provided prefabricated substrate 00 may further include a third film layer 40, the third film layer 40 may be disposed between the first film layer 10 and the first portion 201 of the second film layer 20, and the third film layer 40 may be a flexible film layer, the third film layer 40 may be attached on the first portion 201 of the second film layer 20 through the third adhesive layer 303, and the third film layer 40 may be in direct contact with the first surface 10A of the first film layer 10 — S11

Peeling the second portion 202 and the third portion 203 of the second film layer 20 from the second surface 10B of the first film layer 10 at the gap K of the prefabricated substrate 00, such that the second film layer 20 and the first film layer 10 may be separated — S12

Unfolding the second film layer 20, and cutting the second portion 202 and the third portion 203 along the dashed line M2 (as shown in Figure 24) to obtain the stacked first portion 201 and the third film layer 40, where the first portion 201 and the third film layer 40 may be configured as the flexible substrate 000 — S13

Figure 22

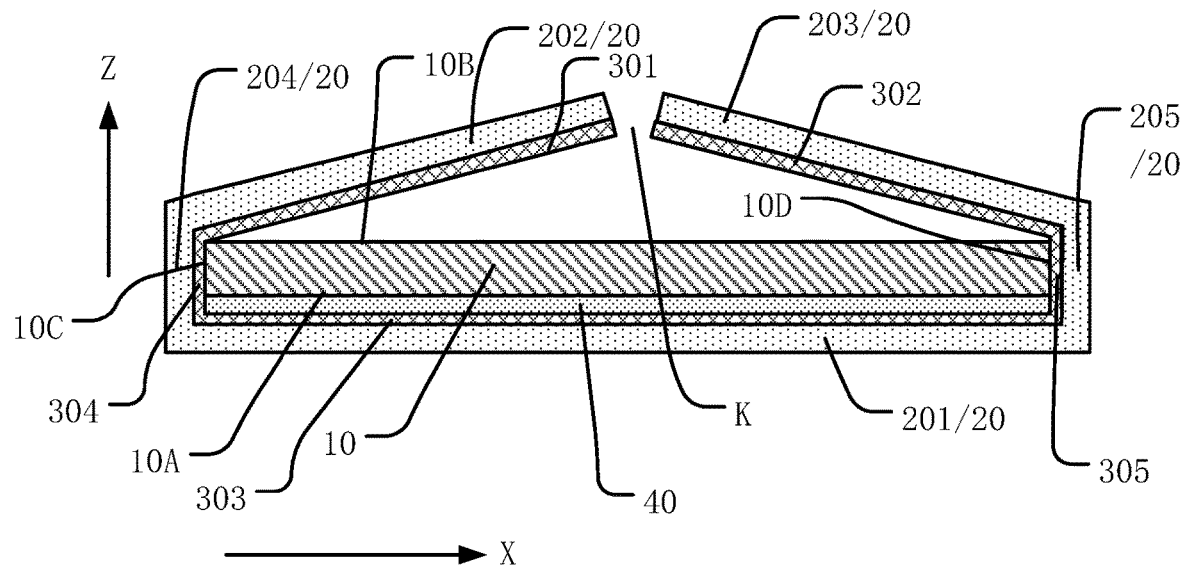

Figure 23

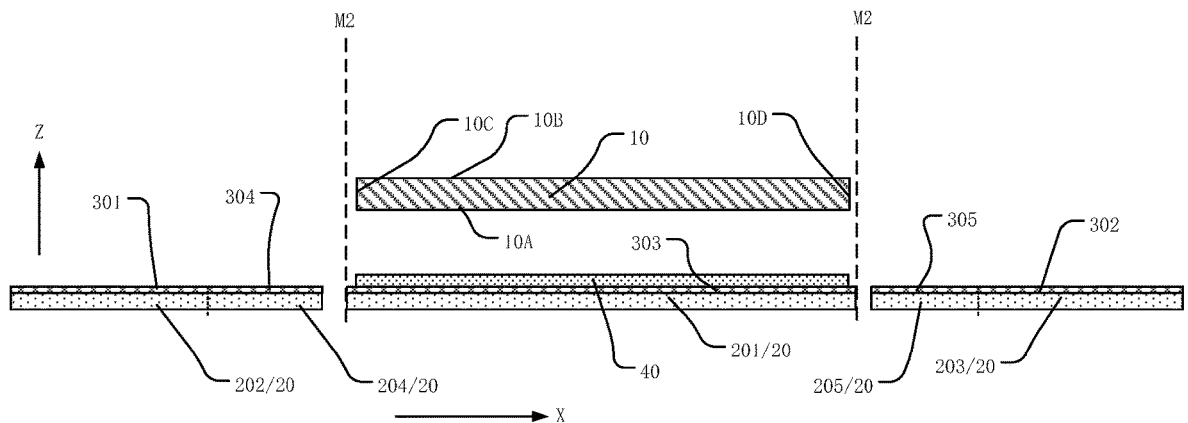

Figure 24

| Providing the prefabricated substrate 00, where in the provided prefabricated substrate 00, the first film layer 10 may include the first side surface 10C and the second side surface 10D that are disposed opposite to each other, the first side surface 10C may intersect with the first surface 10A, and the second side surface 10D may intersect with the first surface 10A | ← S21 |

| At the positions of the first side surface 10C and the second side surface 10D, cutting the second film layer 20 along the direction X parallel to the plane of the first film layer 10, such that the second portion 202, the third portion 203, and the first film layer 10 may be separated from the first portion 201 | ← S22 |

| Configuring the obtained first portion 201 as the flexible substrate 000 | ← S23 |

Figure 25

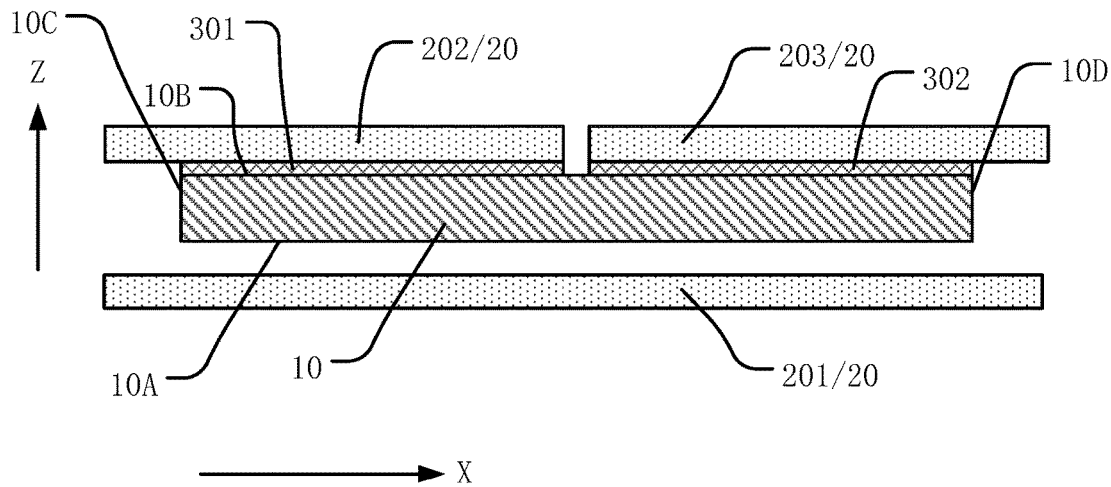

Figure 26

| Providing the prefabricated substrate 00, where in the provided prefabricated substrate 00, the first film layer 10 may include the first side surface 10C and the second side surface 10D that are disposed opposite to each other. The first side surface 10C may intersect with the first surface 10A, and the second side surface 10D may intersect with the first surface 10A, the prefabricated substrate 00 may further include the third film layer 40, the third film layer 40 may be disposed between the first film layer 10 and the first portion 201 of the second film layer 20, and the third film layer 40 may be a flexible film layer, the third film layer 40 may be attached on the first portion 201 of the second film layer 20 through the third adhesive layer 303, and the third film layer 40 may be in direct contact with the first surface 10A of the first film layer 10 | S31 |

↓

| At the positions of the first side surface 10C and the second side surface 10D, cutting the second film layer 20 along the dashed line N2 along the direction X parallel to the plane of the first film layer 10, such that the second portion 202, the third portion 203, and the first film layer 10 may be separated from the first portion 201 | S32 |

↓

| Obtaining the stacked first portion 201 and the third film layer 40, and the first portion 201 and the third film layer 40 may be configured as the flexible substrate 000 | S33 |

Figure 27

PREFABRICATED SUBSTRATE, FLEXIBLE SUBSTRATE, FLEXIBLE MODULE, FABRICATION METHOD, AND DISPLAY DEVICE

CROSS-REFERENCE TO RELATED APPLICATION

This application claims the priority of Chinese patent application No. 202210185640.9, filed on Feb. 28, 2022, the entirety of which is incorporated herein by reference.

FIELD

The present disclosure generally relates to the field of display technology and, more particularly, relates to a prefabricated substrate, a flexible substrate, a flexible module, a fabrication method, and a display device.

BACKGROUND

Flat-panel display devices have many advantages such as thin body, power saving, and no radiation, etc., and have been widely used. Existing flat panel display devices mainly include a liquid crystal display device (LCD) and an organic light emitting display device (OLED). The OLED display device has advantages such as self-luminescence, all-solid-state, and high contrast, etc., and has become the most promising new display device in recent years. The OLED display device is capable of realizing flexible display. The use of a flexible substrate to make a flexible display device that is lightweight, bendable and easy to carry is an important development direction of OLED display devices. In recent years, the flexible substrate has also been gradually used in the non-display flexible product such as a flexible dimming product.

In an existing fabrication process of the flexible product, after forming the related structures of the flexible product on a flexible layer formed on a rigid layer, the flexible product including the flexible layer is peeled from the rigid layer, thereby realizing flexibility of the flexible product. However, because the flexible layer and the rigid layer are bonded on one side, and the thermal expansion coefficient of the material of the flexible layer is different from the thermal expansion coefficient of the rigid material, in a subsequent high-temperature fabrication process of the flexible product, the bonded flexible layer and the rigid layer tend to have a warpage issue, which causes peeling (or detachment) of the flexible layer from other layers of the flexible product. To reduce the degree of warpage, a low-warp and easy-to-separate glue material is often used between the flexible layer and the rigid layer, however, this kind of glue material is expensive and the cost is quite high. Therefore, the existing fabrication process of the flexible product is not only difficult and expensive, but also tends to have problems of warpage and easy peeling of the flexible film layers, which hinders the subsequent improvement of the production yield.

Therefore, how to provide a prefabricated substrate, a flexible substrate, a flexible module, a fabrication method, and a display device that are capable of realizing the fabrication of flexible product, resolving the problems of warpage and easy peeling of the flexible film layers in the peeling process of the flexible film layer from the rigid layer, facilitating to reduce the process difficulty, improving the production yield, and having low cost is an urgent technical problem that needs to be solved.

SUMMARY

One aspect of the present disclosure provides a prefabricated substrate. The prefabricated substrate includes a first film layer and a second film layer. The first film layer is a rigid film layer, the second film layer is a flexible film layer, and the second film layer at least partially wraps the first film layer. When the second film layer is flattened, the second film layer at least includes a first region, and a second region and a third region that are located on opposite sides of the first region. The second film layer at least further includes a first portion, a second portion and a third portion. The first portion is located in the first region, the second portion is located in the second region, and the third portion is located in the third region. In a direction perpendicular to a plane of the first film layer, the first film layer includes a first surface and a second surface that are disposed opposite to each other. The first portion is located on a side of the first surface away from the second surface, and the second portion and the third portion are located on a side of the second surface away from the first surface. The second portion is attached on the second surface through a first adhesive layer, and the third portion is attached on the second surface through a second adhesive layer. In a direction parallel to the plane of the first film layer, along a direction pointing from the second portion to the third portion, an end of the second portion adjacent to the third portion and an end of the third portion adjacent to the second portion are spaced apart by a gap.

Another aspect of the present disclosure provides a fabrication method of a flexible substrate. The method includes providing a prefabricated substrate. The prefabricated substrate includes a first film layer and a second film layer. The first film layer is a rigid film layer, the second film layer is a flexible film layer, and the second film layer at least partially wraps the first film layer. When the second film layer is flattened, the second film layer at least includes a first region, and a second region and a third region that are located on opposite sides of the first region. The second film layer at least further includes a first portion, a second portion and a third portion. The first portion is located in the first region, the second portion is located in the second region, and the third portion is located in the third region. In a direction perpendicular to a plane of the first film layer, the first film layer includes a first surface and a second surface that are disposed opposite to each other. The first portion is located on a side of the first surface away from the second surface, and the second portion and the third portion are located on a side of the second surface away from the first surface. The second portion is attached on the second surface through a first adhesive layer, and the third portion is attached on the second surface through a second adhesive layer. In a direction parallel to the plane of the first film layer, along a direction pointing from the second portion to the third portion, an end of the second portion adjacent to the third portion and an end of the third portion adjacent to the second portion are spaced apart by a gap. The method also includes peeling the second portion and the third portion of the second film layer from the second surface of the first film layer at the gap between the second portion and the third portion, to separate the second film layer from the first film layer. Further, the method includes unfolding the second film layer, and cutting the second portion and the third portion to obtain the separated first portion. The first portion is configured as the flexible substrate.

Another aspect of the present disclosure provides a fabrication method of a flexible module. The method includes providing a first prefabricated substrate including a prefabricated substrate. The prefabricated substrate includes a first film layer and a second film layer. The first film layer is a rigid film layer, the second film layer is a flexible film layer, and the second film layer at least partially wraps the first film layer. When the second film layer is flattened, the second film layer at least includes a first region, and a second region and a third region that are located on opposite sides of the first region. The second film layer at least further includes a first portion, a second portion and a third portion. The first portion is located in the first region, the second portion is located in the second region, and the third portion is located in the third region. In a direction perpendicular to a plane of the first film layer, the first film layer includes a first surface and a second surface that are disposed opposite to each other. The first portion is located on a side of the first surface away from the second surface, and the second portion and the third portion are located on a side of the second surface away from the first surface. The second portion is attached on the second surface through a first adhesive layer, and the third portion is attached on the second surface through a second adhesive layer. In a direction parallel to the plane of the first film layer, along a direction pointing from the second portion to the third portion, an end of the second portion adjacent to the third portion and an end of the third portion adjacent to the second portion are spaced apart by a gap. The method also includes forming a first electrode layer and a first alignment layer on a side of the first portion of the first prefabricated substrate away from the first film layer. The first electrode layer is located on a side of the first portion of the first prefabricated substrate away from the first film layer, and the first alignment layer is located on a side of the first electrode layer away from the first prefabricated substrate. In addition, the method includes providing a second prefabricated substrate including the prefabricated substrate. Moreover, the method includes forming a second electrode layer and a second alignment layer on a side of the first portion of the second prefabricated substrate away from the first film layer. The second electrode layer is located on a side of the first portion of the second prefabricated substrate away from the first film layer, and the second alignment layer is located on a side of the second electrode layer away from the second prefabricated substrate. In each of the first prefabricated substrate and the second prefabricated substrate, the first film layer includes a first side surface and a second side surface that are disposed opposite to each other, the first side surface intersects with the first surface, and the second side surface intersects with the first surface. Further, the method includes fixing the first prefabricated substrate and the second prefabricated substrate into a box. The first prefabricated substrate is disposed on a side of the first alignment layer away from the second prefabricated substrate, and the second prefabricated substrate is disposed on a side of the second alignment layer away from the first prefabricated substrate. A liquid crystal layer is disposed between the first prefabricated substrate and the second prefabricated substrate. Furthermore, the method includes at positions of the first side surface and the second side surface of the first prefabricated substrate, cutting the second film layer along the direction parallel to the plane of the first film layer, to separate the second portion, the third portion, and the first film layer of the first prefabricated substrate from the first portion. The method further includes at positions of the first side surface and the second side surface of the second prefabricated substrate, cutting the second film layer along the direction parallel to the plane of the first film layer, to separate the second portion, the third portion, and the first film layer of the second prefabricated substrate from the first portion. The method further includes obtaining the flexible module.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

FIG. 22 illustrates a schematic flow chart of another exemplary fabrication method of a flexible substrate consistent with disclosed embodiments of the present disclosure;

FIG. 23 illustrates a schematic diagram of a semiconductor structure corresponding to a stage of peeling a second portion and a third portion of a second film layer from a second surface of a first film layer in the fabrication method of the flexible substrate in FIG. 22 consistent with disclosed embodiments of the present disclosure;

FIG. 24 illustrates a schematic diagram of a semiconductor structure corresponding to a stage of cutting a second portion and a third portion of a second film layer after unfolding the second film layer in the fabrication method of the flexible substrate in FIG. 22 consistent with disclosed embodiments of the present disclosure;

FIG. 25 illustrates a schematic flow chart of another exemplary fabrication method of a flexible substrate consistent with disclosed embodiments of the present disclosure;

FIG. 26 illustrates a schematic diagram of a semiconductor structure corresponding to a stage of separating a second portion, a third portion and a first film layer from a first portion in the fabrication method of the flexible substrate in FIG. 25 consistent with disclosed embodiments of the present disclosure;

FIG. 27 illustrates a schematic flow chart of another exemplary fabrication method of a flexible substrate consistent with disclosed embodiments of the present disclosure;

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
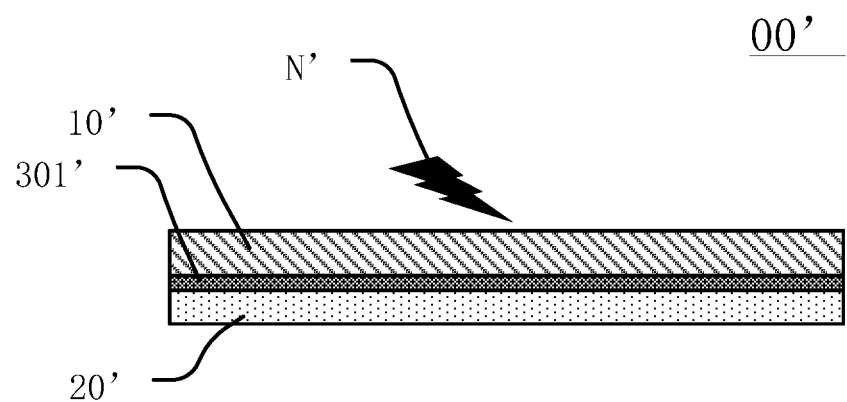
FIG. 1 illustrates a schematic diagram of a prefabricated substrate for forming a flexible module.
Figure 2:
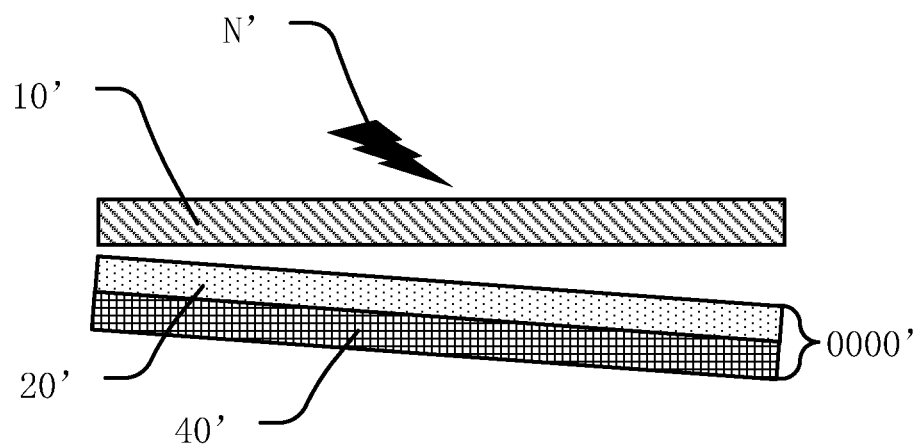
FIG. 2 illustrates a schematic diagram of the prefabricated substrate in FIG. 1 after performing a laser lift-off.
Figure 3:
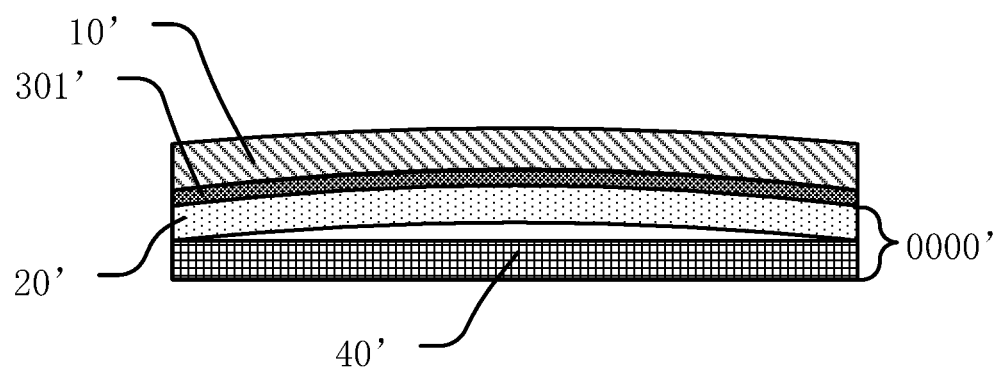
FIG. 3 illustrates a schematic diagram of the prefabricated substrate in FIG. 1 having a warpage problem during a fabrication process of the flexible module.

FIG. 1 illustrates a schematic diagram of a prefabricated substrate for forming a flexible module, FIG. 2 illustrates a schematic diagram of the prefabricated substrate in FIG. 1 after performing a laser lift-off, and FIG. 3 illustrates a schematic diagram of the prefabricated substrate in FIG. 1 having a warpage problem during a fabrication process of the flexible module. Referring to FIGS. 1-3, during the fabrication process of a flexible module 0000', any other film layer structure 40' of a flexible module (as shown in FIG. 2) is often formed on a flexible layer 20' formed on a rigid layer 10'. For example, a plurality of pixel structures are formed on the flexible layer 20', to form a flexible display substrate on the rigid layer 10'. Alternatively, a liquid crystal dimming film is formed on the flexible layer 20', to form a flexible dimming substrate on the rigid layer 10'. Then the flexible module 0000' including the flexible layer 20' is peeled from the rigid layer 10', thereby achieving flexibility of the flexible module 0000'.

Referring to FIG. 1 and FIG. 2, a prefabricated substrate 00' for forming the flexible module includes the flexible layer 20' and the rigid layer 10', and the flexible layer 20' and the rigid layer 10' are pre-bonded by a laser burning layer 301'. After continuing to form the any other film structure 40' of the flexible module on the flexible layer 20', the flexible layer 20' is peeled from the rigid layer 10' by a laser irradiation scanning method, e.g., a laser lift-off (LLO) method. The laser N' is scanned and irradiated from the side of the rigid layer 10' away from the flexible layer 20', and the laser N' is incident on the rigid layer 10' and passes through the rigid layer 10' to be irradiated on the side surface of the flexible layer 20' facing towards the rigid layer 10'. The molecular chains of the laser burning layer 301' are broken, and the flexible layer 20' and the rigid layer 10' are separated from each other. In other words, the flexible module 0000' is separated from the rigid layer 10' to finish the preparation. However, because the flexible layer 20' and the rigid layer 10' are bonded on one side, and the thermal expansion coefficient of the material of the flexible layer 20' is different from the thermal expansion coefficient of the material of the rigid layer 10', in the subsequent high temperature process of forming the flexible module, the flexible layer 20' and the rigid layer 10' that are bonded on one side tend to have warpage problem (as shown in FIG. 3), which causes a peeling (or detachment) problem between the flexible layer 20' and the any other film structure 40' of the flexible module.

Figure 4:
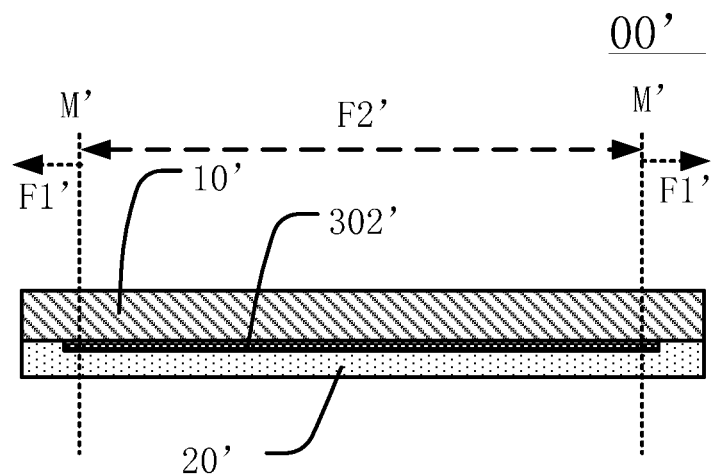
FIG. 4 illustrates a schematic diagram of another prefabricated substrate for forming a flexible module.
Figure 5:
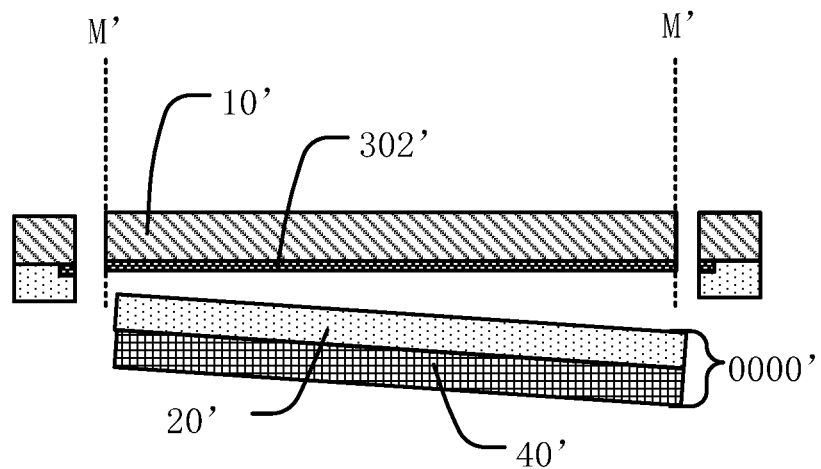
FIG. 5 illustrates a schematic diagram of the prefabricated substrate in FIG. 4 after performing a laser lift-off.
Figure 6:
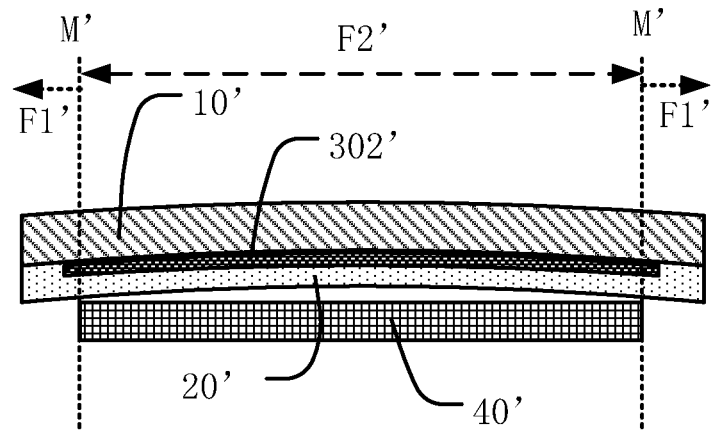
FIG. 6 illustrates a schematic diagram of the prefabricated substrate in FIG. 4 having a warpage problem during a fabrication process of the flexible module.

FIG. 4 illustrates a schematic diagram of another prefabricated substrate for forming a flexible module; FIG. 5 illustrates a schematic diagram of the prefabricated substrate in FIG. 4 after performing a laser lift-off; and FIG. 6 illustrates a schematic diagram of the prefabricated substrate in FIG. 4 having a warpage problem during a fabrication process of the flexible module. Referring to FIGS. 4-6, the prefabricated substrate 00' for forming the flexible module 0000' includes the flexible layer 20' and the rigid layer 10', and the flexible layer 20' and the rigid layer 10' include a direct bonding region F1' and an indirect bonding region F2'. The direct bonding region F1' is located at an edge position, and the flexible layer 20' and the rigid layer 10' in the indirect bonding region F2' are fixedly bonded through a separation layer 302'. After continuing to form any other film layer structure 40' of the flexible module (as shown in FIG. 5) on the flexible layer 20' formed on the rigid layer 10', the rigid layer 10' may be peeled from the flexible display module 0000'.

When performing a peeling, the flexible layer 20' and the rigid layer 10' are first cut along a dashed line M' in FIG. 5, such that the direct bonding region F1' and the indirect bonding region F2' are split, and then the flexible layer 20' and the rigid layer 10' are fully separated by mechanical method. The separation layer 302' in the prefabricated substrate 00' shown in FIG. 4 is often made of a low-warp and easy-to-separate glue material, however such kind of glue material is expensive and the cost is quite high. The flexible layer 20' is directly bonded with the rigid layer 10' at the edge position without the separation layer 302'. The area of the direct bonding region F1' is small, and the peeling (as shown in FIG. 6) of any other film layer structure 40' from the flexible layer 20' occurs in the subsequent fabrication process of the flexible module, and the actual useable area of the flexible layer 20' obtained after being cut along the dashed line M' is greatly reduced, which causes a waste.

To solve the above problems, the present disclosure provides a prefabricated substrate, a flexible substrate and a fabrication method, a flexible module and a fabrication method, and a display device, thereby realizing the fabrication of a flexible product, resolving the problems of warpage and easy peeling of the flexible film layer in the process of peeling the flexible film layer from the rigid layer, facilitating to reduce the process difficulty, improving the production yield, and having low cost.

Figure 7:
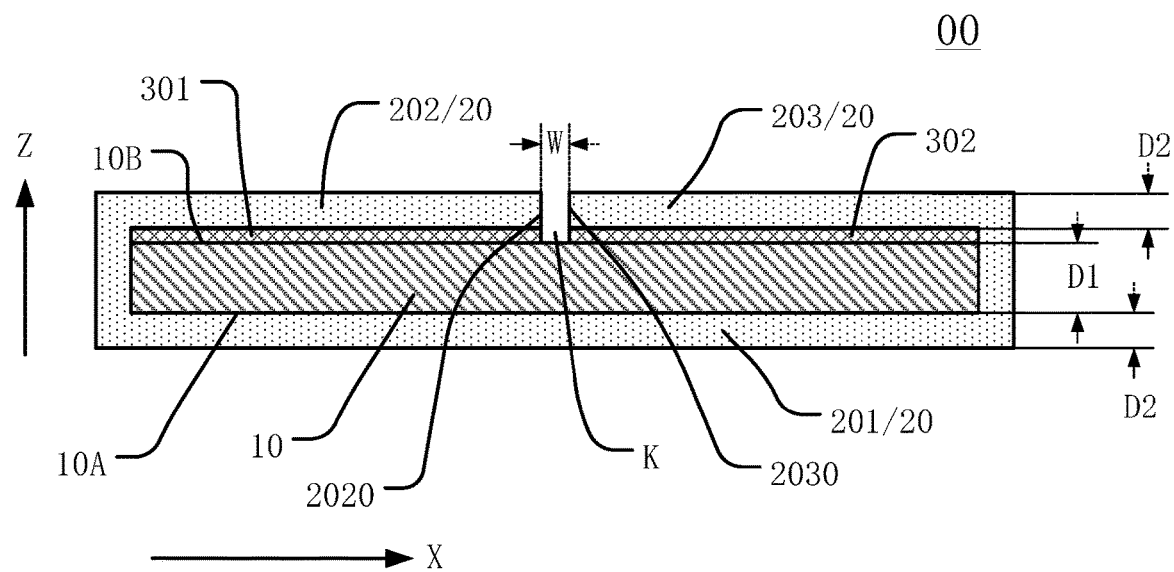
FIG. 7 illustrates a schematic diagram of an exemplary prefabricated substrate consistent with disclosed embodiments of the present disclosure.
Figure 8:
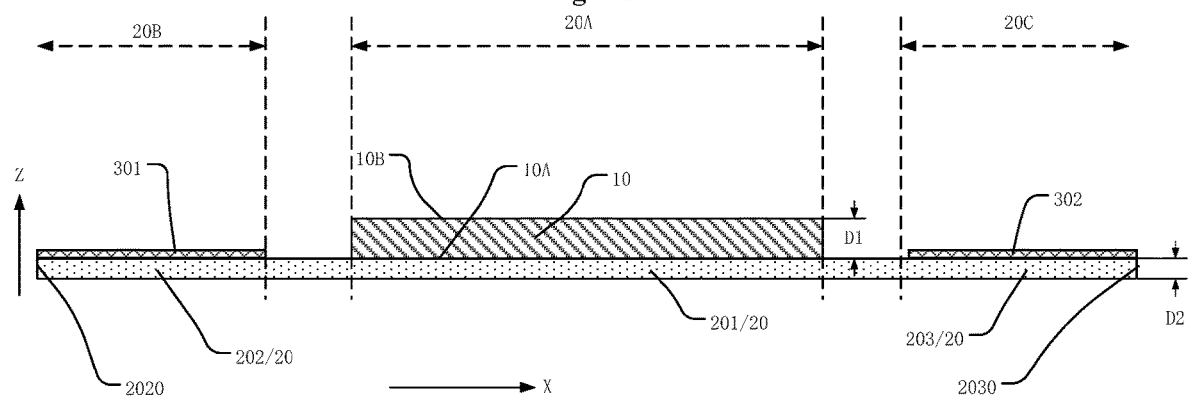
FIG. 8 illustrates a schematic diagram of a semiconductor structure when a first film layer has not been wrapped by a second film layer during a fabrication process of the prefabricated substrate in FIG. 7 consistent with disclosed embodiments of the present disclosure.

FIG. 7 illustrates a schematic diagram of prefabricated substrate consistent with disclosed embodiments of the present disclosure; and FIG. 8 illustrates a schematic diagram of a semiconductor structure when a first film layer has not been wrapped by a second film layer during a fabrication process of the prefabricated substrate in FIG. 7. Referring to FIG. 7 and FIG. 8, the prefabricated substrate 00 may at least include a first film layer 10 and a second film layer 20. The first film layer 10 may be a rigid film layer, and the second film layer 20 may be a flexible film layer. The second film layer 20 may at least partially wrap the first film layer 10.

When the second film layer 20 is flattened, the second film layer 20 may at least include a first region 20A, and a second region 20B and a third region 20C located on opposite sides of the first region 20A. Further, the second film layer 20 may at least include a first portion 201, a second portion 202 and a third portion 203. The first portion 201 may be located in the first region 20A, the second portion 202 may be located in the second region 20B, and the third portion 203 may be located in the third region 20C.

In a direction Z perpendicular to a plane of the first film layer 10, the first film layer 10 may include a first surface 10A and a second surface 10B that are disposed opposite to each other. The first portion 201 may be located on a side of the first surface 10A away from the second surface 10B, and the second portion 202 and the third portion 203 may be located on a side of the second surface 10B away from the first surface 10A.

The second portion 202 may be attached on the second surface 10B through a first adhesive layer 301, and the third portion 203 may be attached on the second surface 10B through a second adhesive layer 302.

In a direction X parallel to the plane of the first film layer 10, along a direction pointing from the second portion 202 to the third portion 203, an end 2020 of the second portion 202 adjacent to the third portion 203 and an end 2030 of the third portion 203 adjacent to the second portion 202 may be spaced apart by a gap K.

In one embodiment, the prefabricated substrate 00 may at least include the first film layer 10 and the second film layer 20, and the first film layer 10 may be a rigid film layer. For example, the first film layer 10 may be a film layer having a planar structure and made of a rigid material such as glass, or ceramics, etc. The second film layer 20 may be a flexible film layer. For example, the second film layer 20 may be a flexible film layer made of a transparent organic polymer material such as PET (polyethylene terephthalate), PI (polyimide), PEN (polyethylene naphthalate), or any other flexible resin. The prefabricated substrate 00 may be used to form a flexible substrate of a flexible display product.

Compared with an existing prefabricated substrate where the flexible layer is directly bonded to the rigid layer, and the flexible display product is formed on the flexible layer formed on the rigid layer, the second film layer 20 of the prefabricated substrate 00 in the disclosed embodiments may at least partially wrap the first film layer 10. Referring to FIG. 8, when the second film layer 20 is flattened, in other words, when the flexible second film layer 20 has not partially wrapped the rigid first film layer 10, the second film layer 20 may at least include the first region 20A, and the second region 20B and the third region 20C that are disposed on opposite sides of the first region 20A. The first portion 201 of the second film layer 20 may be located in the first region 20A, the second portion 202 may be located in the second region 20B, and the third portion 203 may be located in the third region 20C.

FIG. 7 and FIG. 8 in the disclosed embodiments may merely be examples of the division of each part of the second film layer 20, and may not indicate the actual size of the divided region. In one embodiment, each part of the second film layer 20 may be divided according to the width of the first film layer 10 in the direction X parallel to the plane of the first film layer 10 and the thickness of the first film layer 10 in the direction Z perpendicular to the plane of the first film layer 10. In one embodiment, referring to FIG. 7, in the direction Z perpendicular to the plane of the first film layer 10, the first film layer 10 may include the first surface 10A and the second surface 10 that are disposed opposite to each other. The first portion 201 may be located on the side of the first surface 10A away from the second surface 10B, and the second portion 202 and the third portion 203 may be located on a side of the second surface 10B away from the first surface 10A. In other words, the structures of different regions of the second film layer 20 may be located on two sides of different surfaces of the first film layer 10, respectively, such that the flexible second film layer 20 may at least partially wrap the rigid first film layer 10. The first film layer 10 and the second film layer 20 in the disclosed embodiments may form the double-sided attachment effect. In other words, the oppositely disposed first surface 10A and second surface 10B of the first film layer 10 may be attached on the second film layer 20, even if the thermal expansion coefficient of the flexible material of the second film layer 20 is greatly different from the thermal expansion coefficient of the rigid material of the first film layer 10, the warpage of the entire prefabricated substrate 00 may be effectively suppressed.

Figure 9:
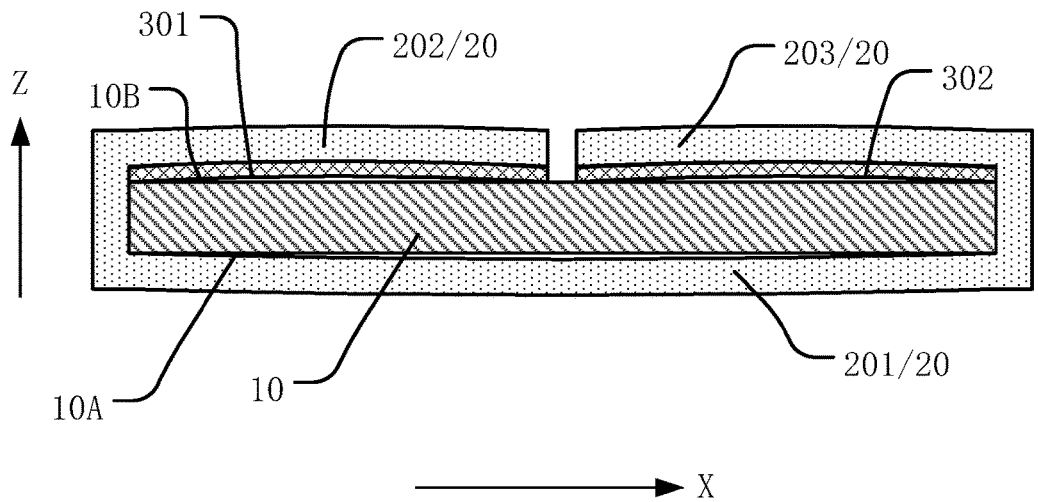
FIG. 9 illustrates a schematic diagram of suppressing warpage after two film layers made of different materials form a double-sided attachment effect consistent with disclosed embodiments of the present disclosure.

FIG. 9 illustrates a schematic diagram of suppressing warpage after two film layers made of different materials form the double-sided attachment effect consistent with disclosed embodiments of the present disclosure. Referring to FIG. 9, when the second film layer 20 and the first film layer 10 form the double-sided attachment effect, an upper stress between the second film layer 20 and the first surface 10A of the first film layer 10 and a lower stress between the second film layer 20 and the second surface 10B of the first film layer 10 may almost cancel each other. Compared with the single-sided attachment (as shown in FIG. 3 and FIG. 6), the effect of suppression warpage may be desired. Referring to FIG. 9, the prefabricated substrate 00 may almost be kept in a horizontal state, such that in the subsequent high-temperature process of using the prefabricated substrate 00 in the disclosed embodiments to form a flexible module, the structure of the second film layer 20 that are attached on both sides of the first film layer 10 may effectively suppress the warpage problem, thereby effectively resolving the peeling of any other film layer of the subsequently formed flexible module from the flexible second film layer 20 of the prefabricated substrate 00, which may facilitate to improve the production yield of flexible modules.

In one embodiment, the second portion 202 of the second film layer 20 may be attached on the second surface 10B through the first adhesive layer 301, and the third portion 203 of the second film layer 20 may be attached on the second surface 10B through the second adhesive layer 302. In other words, the second surface 10B of the first film layer 10 and the partial region of the second film layer 20 may be fixedly bonded by an adhesive material, thereby enhancing the stability of wrapping effect of the first film layer 10 and the second film layer 20 of the prefabricated substrate 00, and enhancing the bonding force between the first film layer 10 and the second film layer 20, which may facilitate to suppress the warpage of the film layer. Optionally, the first adhesive layer 301 and the second adhesive layer 302 in the disclosed embodiments may be formed in a same layer and made of a same colloidal material that is disposed between the first film layer 10 and the second film layer 20. In one embodiment, the first adhesive layer 301 and the second adhesive layer 302 may be made of any adhesive material with stickiness, such as an adhesive material for mechanical peeling, UV dissociative adhesive (photosensitive adhesive) for a laser lift-off, or any other commonly used adhesive material, and may not need to be a special adhesive material with low warpage and high cost, which may facilitate to reduce the manufacturing cost of the prefabricated substrate 00.

In one embodiment, in the direction X parallel to the plane of the first film layer 10, along the direction pointing from the second portion 202 to the third portion 203, the end 2020 of the second portion 202 adjacent to the third portion 203 and the end 2030 of the third portion 203 adjacent to the second portion 202 may be spaced apart by a gap K. The gap K may provide a cut-in point for peeling the second film layer from the first film layer after subsequently forming any other film layer structure of the flexible module on the second film layer 20, and may prevent the second film layer 20 from fully wrapping the first film layer 10 without the cut-in point for peeling, which may reduce the difficulty of the subsequent peeling process and may improve the efficiency of the peeling process.

In one embodiment, referring to FIG. 7, in the subsequent process of using the prefabricated substrate 00 in the disclosed embodiments to manufacture a flexible module, any other film layer structure of the flexible module, such as a metal layer, a thin film transistor device, an electrode layer, any insulating layer, an alignment layer and any other functional structure (not shown in the Figures), may be formed on the side of the first portion 201 of the prefabricated substrate 00 away from the first film layer 10. Any other treatment may not be performed on the side of the second portion 202 and the third portion 203 of the prefabricated substrate 00 away from the first film layer 10. When forming the prefabricated substrate 00, the first adhesive layer 301 and the second adhesive layer 302 may be disposed between each of the second portion 202 and the third portion 203 of the second film layer and the first film layer 10, respectively. There may be no adhesive layer between the first portion 201 of the second film layer 20 and the first film layer 10. In one embodiment, the first surface 10A may be in direct contact with the first portion 201, and the first portion 201 of the second film layer 20 and the first surfaces 10A of the first film layer 10 may be attached by electrostatic adsorption when being in direct contact with each other.

Figure 10:
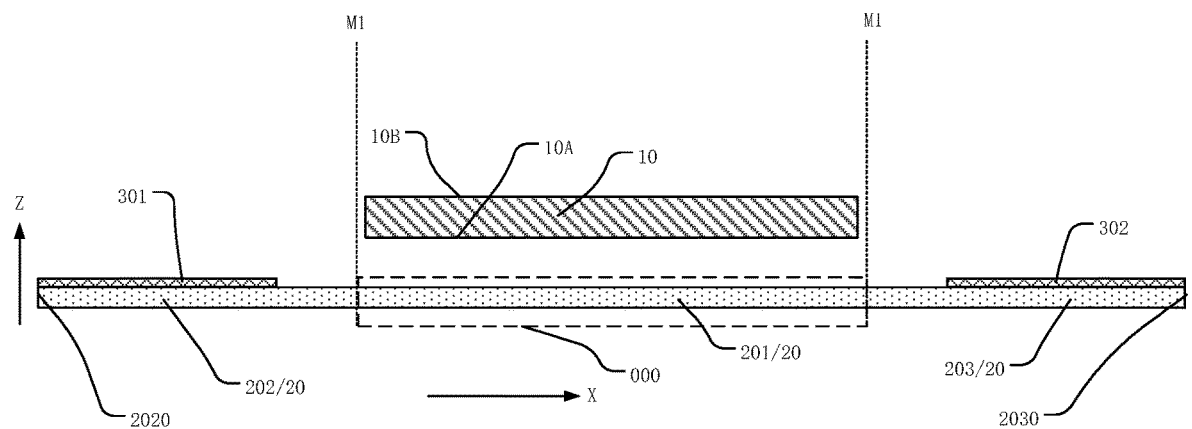
FIG. 10 illustrates a schematic diagram of the prefabricated substrate in FIG. 7 after peeling the first film layer from the second film layer consistent with disclosed embodiments of the present disclosure.

FIG. 10 illustrates a schematic diagram of the prefabricated substrate in FIG. 7 after peeling the first film layer from the second film layer. Referring to FIG. 10, after forming any other film layer structure (not shown in FIG. 10) of the flexible module on the side of the first portion 201 of the prefabricated substrate 00 away from the first film layer 10, mechanically peeling may be directly performed from the gap K between the second portion 202 and the third portion 203 of the prefabricated substrate 00 on the second surface 10B of the first film layer 10, and the laser lift-off process may not be needed, which may facilitate to reduce cost. The functional device structure may not be formed on the side of the second portion 202 and the third portion 203 of the prefabricated substrate 00 away from the first film layer 10, and the deformation may not affect the production yield, such that the gap K may be used as the cut-in point to perform peeling.

There may be no sticky adhesive layer between the first portion 201 of the second film layer 20 and the first film layer 10, which may make it substantially easy to achieve peeling, and may further reduce the difficulty of peeling the subsequently formed flexible module from the rigid first film layer 10. Then, the second portion 202 with the first adhesive layer 301 and the third portion 203 with the second adhesive layer 302 may be respectively cut along the dashed line M1 in FIG. 10, to obtain the flexible module including the flexible first portion 201 as a flexible substrate. It should be understood that because the first portion 201 of the second film layer 20 is needed when using the prefabricated substrate 00 in the disclosed embodiments to form the flexible module, even if the first adhesive layer 301 and the second adhesive layer 302 are retained on the second surface 10B of the first film layer 10 when performing mechanical peeling, the use effect of the first portion 201 of the second film layer 20 may not be affected.

Figure 11:
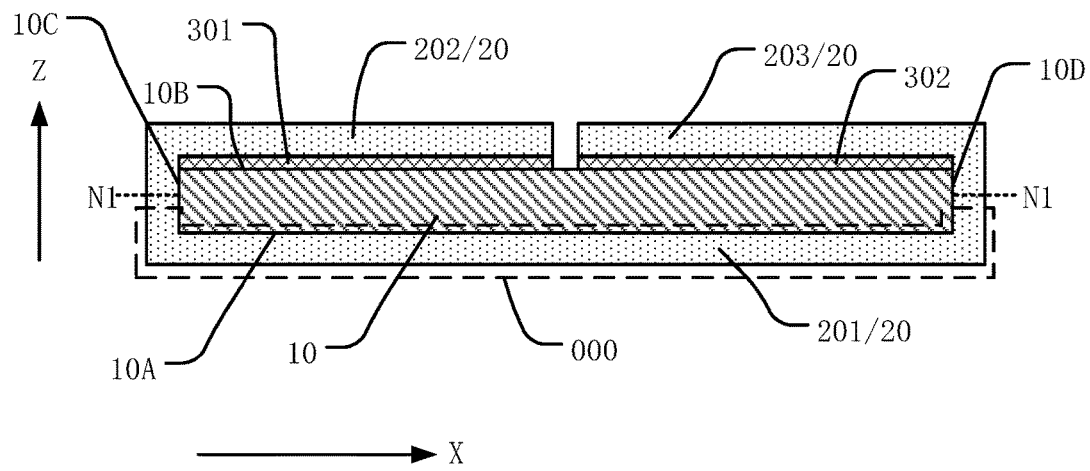
FIG. 11 illustrates another schematic diagram of the prefabricated substrate in FIG. 7 after peeling the first film layer from the second film layer consistent with disclosed embodiments of the present disclosure.

FIG. 11 illustrates another schematic diagram of the prefabricated substrate in FIG. 7 after peeling the first film layer from the second film layer. Referring to FIG. 11, after the any other film layer structure of the flexible module (not shown in FIG. 11) is formed on the side of the first portion 201 of the prefabricated substrate 00 away from the first film layer 10, the second film layer 20 may be cut along the direction X parallel to the plane of the first film layer 10 (cut along the dashed line N1 as shown in FIG. 11), such that the first portion 201 of the second film layer 20 may be separated from the second portion 202 and the third portion 203 thereof. Because the second portion 202 is attached on the second surface 10B of the first film layer 10 through the first adhesive layer 301, and the third portion 203 is attached on the second surface 10B of the first film layer 10 through the second adhesive layer 302, the rigid first film layer 10 may be separated from the flexible first portion 201 as the second portion 202 and the third portion 203 are separated from the first portion 201. Because there is no adhesive layer between the first portion 201 of the second film layer 20 and the first film layer 10, directly realizing the mechanical peeling may be substantially easy. Further, cutting the second film layer 20 along the dashed line N1 along the direction X parallel to the plane of the first film layer 10 may not require the use of special cutting equipment, and an ordinary utility knife may be capable of cutting the flexible second film layer 20, such that the flexible module including the flexible first portion 201 may be directly obtained, which may facilitate to reduce the manufacturing cost.

The prefabricated substrate 00 in the disclosed embodiments may not only avoid warpage through the double-sided attachment effect of first film layer 10 and the second film layer 20, but also facilitate to resolve the peeling problem when subsequently using the prefabricated substrate 00 to form a flexible module. Further, in the subsequent process of peeling the first film layer 10 from the second film layer 20, the rigid film layer of the prefabricated substrate 00 may not need to be cut, such that the rigid first film layer 10 may be reused, which may not only reduce the cost, but also maximize the use of the large area of the first film layer 10 and the second film layer 20. Therefore, the effective area of the formed flexible module may be large enough to avoid the problems of sacrificing the actual usable area of the second film layer 20 caused by cutting the edge region of the prefabricated substrate, and the cost may be reduced while ensuring the production yield.

It should be understood that the present disclosure may not specifically limit the product type of the flexible module that is capable of being formed using the prefabricated substrate 00, and the flexible module that needs to be fabricated using a flexible substrate may be formed using the prefabricated substrate 00 in the disclosed embodiments, which may not be repeated herein. To clearly illustrate the first film layer 10, the second film layer 20, and any other structure, in the Figures of the disclosed embodiments, the film thickness of the film layer may be enlarged. In an actual implementation, the thickness of each film layer in the prefabricated substrate 00 may be substantially small, which may be at the μm level. When the second film layer 20 at least partially wraps the first film layer 10, the edges and corners shown in the Figure may not appear. The Figure may merely be for illustration purpose, and may not represent the actual shape of the structure.

It should be noted that in one embodiment, the thicknesses of the first film layer 10, the second film layer 20, the first adhesive layer 301 and the second adhesive layer 302 may not be specifically limited, as long as the thicknesses of the first adhesive layer 301 and the second adhesive layer 302 satisfy the bonding stability of the second portion 202, the third portion 203 and the first film layer 10. The thickness of the first film layer 10 may be determined according to the thickness of the substrate required by the actual flexible module. The thickness of the first film layer 10 may merely need to have sufficient rigidity to support the flexible second film layer 20, which may not be repeated herein.

Optionally, in one embodiment, in the direction X parallel to the plane of the first film layer 10, along the direction pointing from the second portion 202 to the third portion 203, a width W of the gap K between the end 2020 of the second portion 202 adjacent to the third portion 203 and the end 2030 of the third portion 203 adjacent to the second portion 202 may be as narrow as possible. The width W may merely need to satisfy that when performing the mechanical peeling on the first film layer 10 and the second film layer 20, the width W may be large enough for cut-in point, and at the same time, bonding region between the second portion 202 and the third portion 203 of the second film layer 20 and the second surface 10B of the first film layer 10 may be substantially large. Therefore, the first surface 10A of the first film layer 10 may be subjected to a stress adjacent to the second surface 10B of the first film layer 10 from the flexible second film layer 20, which may effectively suppress the warpage. The width W of the gap K may not be limited by the present disclosure.

In certain embodiments, referring to FIG. 7 and FIG. 8, in the direction Z perpendicular to the plane of the first film layer 10, the thickness D1 of the first film layer 10 may be greater than the thickness D2 of the second film layer 20.

In the present disclosure, the thickness D1 of the rigid first film layer 10 of the prefabricated substrate 00 may be substantially thick. In other words, in the direction Z perpendicular to the plane of the first film layer 10, the thickness D1 of the first film layer 10 may be set greater than the thickness D2 of the second film layer 20, to have sufficient strength to support the second film layer 20. Because when using the prefabricated substrate 00 in the disclosed embodiments to form the flexible module, the rigid first film layer 10 may be ultimately detached from the first portion 201 of the second film layer 20, even if the thickness D1 of the first film layer 10 is substantially thick, the thickness of the subsequently formed flexible module may not be affected. Therefore, the thickness D1 of the first film layer 10 may be set substantially thick, which may effectively support the flexible second film layer 20.

It should be noted that the thickness D1 of the first film layer 10 may not be specifically limited by the present disclosure, as long as the first film layer 10 is capable of supporting the second film layer 20 and subsequently formed any other film layer of the flexible module. The thickness D2 of the second film layer 20 may set according to actual production requirements, which may not be limited by the present disclosure.

Figure 12:
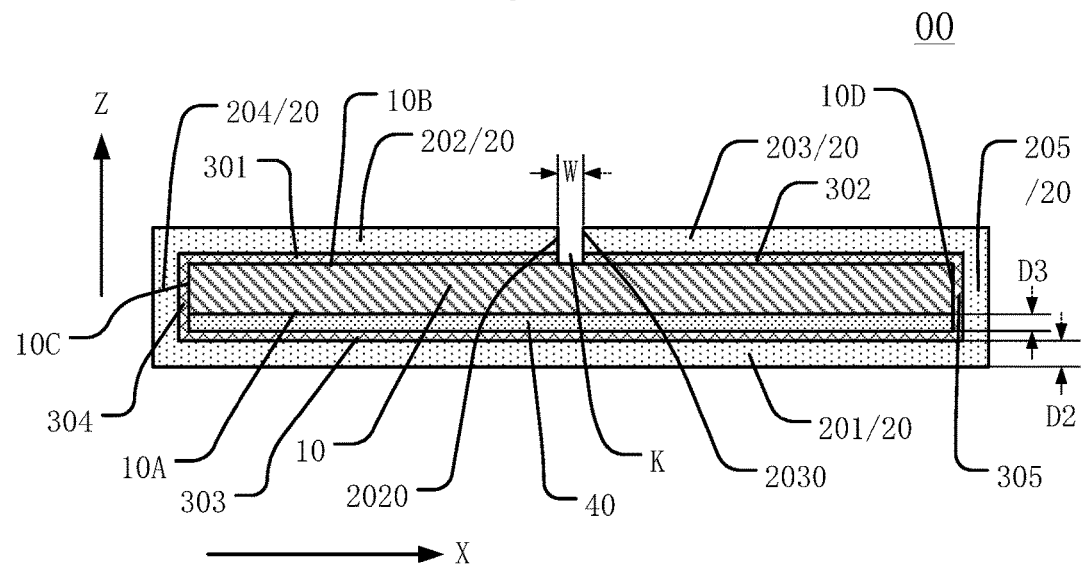
FIG. 12 illustrates a schematic diagram of another exemplary prefabricated substrate consistent with disclosed embodiments of the present disclosure.
Figure 13:
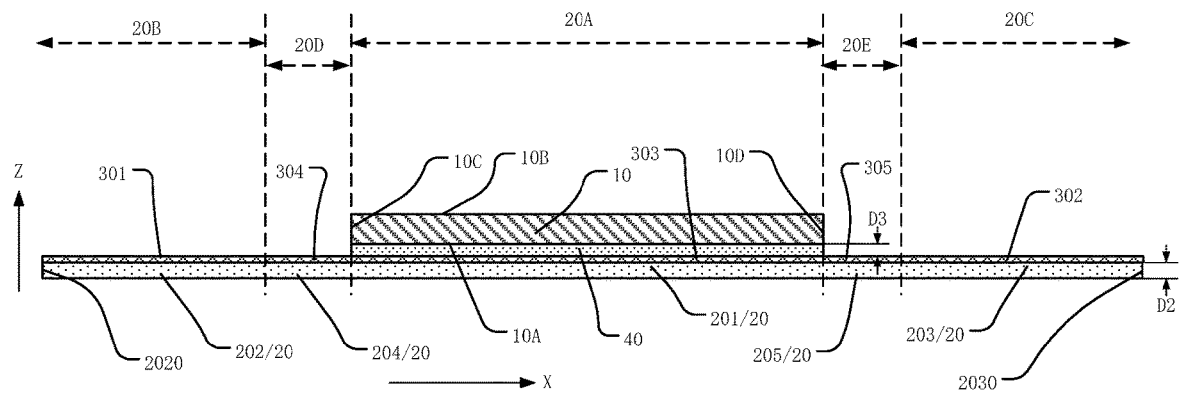
FIG. 13 illustrates a schematic diagram of a semiconductor structure when a first film layer has not been wrapped by a second film layer during a fabrication process of the prefabricated substrate in FIG. 12 consistent with disclosed embodiments of the present disclosure.
Figure 14:
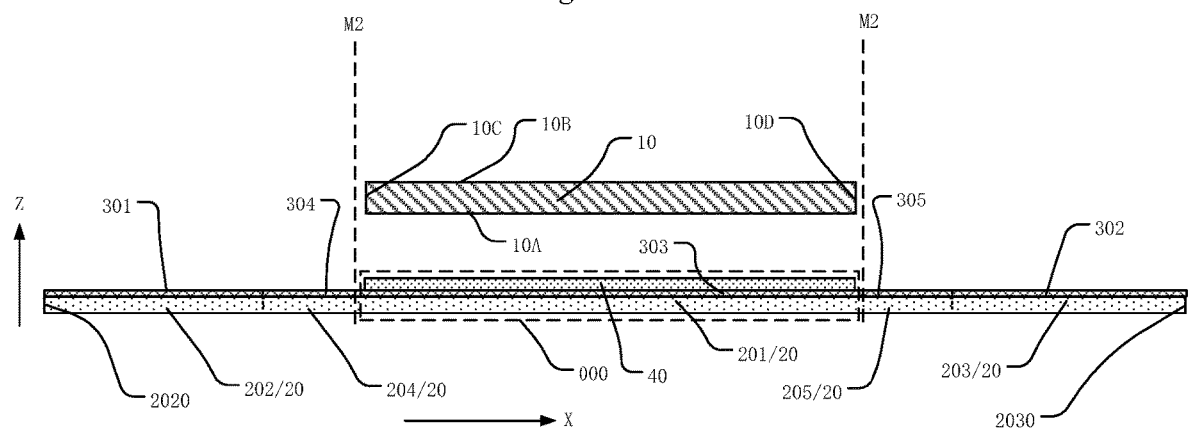
FIG. 14 illustrates a schematic diagram of the prefabricated substrate in FIG. 12 after peeling the first film layer from the second film layer consistent with disclosed embodiments of the present disclosure.
Figure 15:
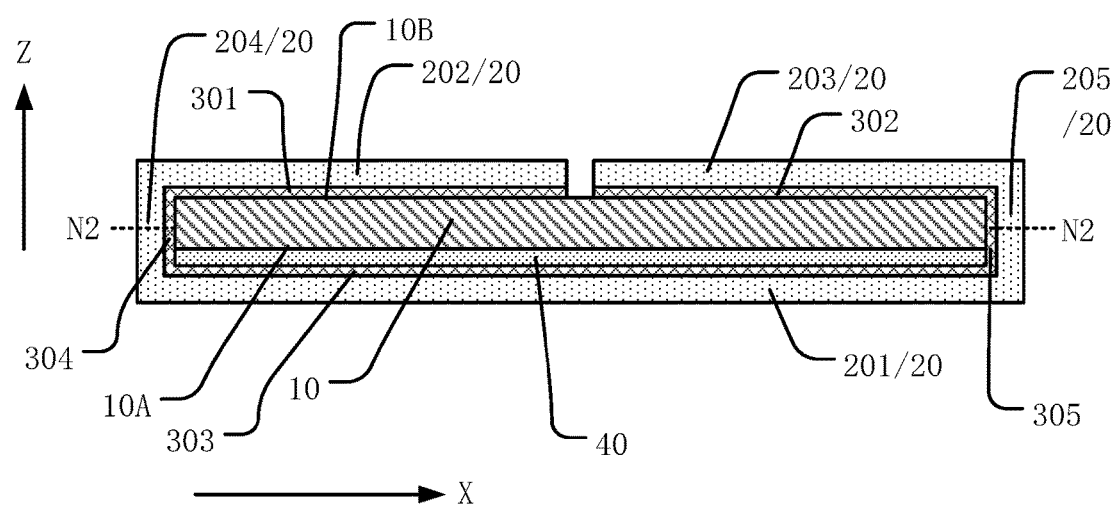
FIG. 15 illustrates another schematic diagram of the prefabricated substrate in FIG. 12 after peeling the first film layer from the second film layer consistent with disclosed embodiments of the present disclosure.

FIG. 12 illustrates a schematic diagram of another prefabricated substrate consistent with disclosed embodiments of the present disclosure; FIG. 13 illustrates a schematic diagram of a semiconductor structure when the first film layer has not been wrapped by the second film layer during a fabrication process of the prefabricated substrate in FIG. 12; FIG. 14 illustrates a schematic diagram of the prefabricated substrate in FIG. 12 after peeling the first film layer from the second film layer; and FIG. 15 illustrates another schematic diagram of the prefabricated substrate in FIG. 12 after peeling the first film layer from the second film layer. In certain embodiments, referring to FIGS. 12-15, a third film layer 40 may be disposed between the first film layer 10 and the first portion 201 of the second film layer 20, and the third film layer 40 may be a flexible film layer.

The third film layer 40 may be attached on the first portion 201 of the second film layer 20 through a third adhesive layer 303, and the third film layer 40 may be in direct contact with the first surface 10A of the first film layer 10.

In one embodiment, when the third film layer 40 is disposed between the first film layer 10 and the first portion 201 of the second film layer 20, the second film layer 20 may further include a fourth region 20D and a fifth region 20E. When the second film layer 20 is flattened, the fourth region 20D may be located between the first region 20A and the second region 20B, and the fifth region 20E may be located between the first region 20A and the third region 20C.

The second film layer 20 may further include the fourth portion 204 and the fifth portion 205. The fourth portion 204 may be located in the fourth region 20D, and the fifth portion 205 may be located in the fifth region 20E.

The first film layer 10 may include a first side surface 10C and a second side surface 10D that are disposed opposite to each other. The first side surface 10C may intersect with the first surface 10A, and the second side surface 10D may intersect with the first surface 10A.

The fourth portion 204 may be attached on the first side surface 10C of the first film layer 10 through a fourth adhesive layer 304, and the fifth portion 205 may be attached on the second side surface 10D of the first film layer 10 through a fifth adhesive layer 305.

Further, in one embodiment, the first adhesive layer 301, the second adhesive layer 302, the third adhesive layer 303, the fourth adhesive layer 304, and the fifth adhesive layer 305 may be integrally formed into one piece. In other words, the first adhesive layer 301, the second adhesive layer 302, the third adhesive layer 303, the fourth adhesive layer 304, and the fifth adhesive layer 305 may have an adhesive layer structure formed on the entire surface of the second film layer 20 in a same layer and by a same process, which may facilitate to simplify the process steps.

The present disclosure may explain that the flexible third film layer 40 may be disposed between the rigid first film layer 10 and the flexible second film layer 20, and the third film layer 40 may be disposed between the first portion 201 of the second film layer 20 and the first film layer 10. The surface of the third film layer 40 facing towards the first portion 201 of the second film layer 20 may be fixedly attached on the first portion 201 of the second film layer 20 by the third adhesive layer 303. The surface of the third film layer 40 facing towards the first film layer 10 may be in direct contact with the first surface 10A of the first film layer 10. In other words, the first surface 10A of the first film layer 10 and the third film layer 40 may be in direct contact with each other, and may be attached by electrostatic adsorption.

Due to the disposure of the third film layer 40, the adhesive layer between the first film layer 10 and the second film layer 20 may not need to be disposed in sub-regions. In other words, the second film layer 20 may warp part of the first film layer 10 through the adhesive layer formed on the entire surface of the second film layer 20. In one embodiment, the second film layer 20 may include the fourth region 20D and the fifth region 20E. When the second film layer 20 is flattened, in other words, when the flexible second film layer 20 has not partially wrapped the rigid first film layer 10 (as shown in FIG. 13), the second film layer 20 may at least further include the fourth region 20D and the fifth region 20E. The fourth region 20D may be located between the first region 20A and the second region 20B, and the fifth region 20E may be located between the first region 20A and the third region 20C. The fourth portion 204 of the second film layer 20 may be located in the fourth region 20D, and the fifth portion 205 of the second film layer 20 may be located in the fifth region 20E. Therefore, the entire second film layer 20 may be divided into at least five parts.

In the direction Z perpendicular to the plane of the first film layer 10, the first portion 201 may be located on the side of the third film layer 40 away from the second surface 10B of the first film layer 10, and the second portion 202 and the third portion 203 may be located on the side of the second surface 10B of the first film layer 10 away from the first surface 10A. The first film layer 10 may include the first side surface 10C and the second side surface 10D that are disposed opposite to each other. The first side surface 10C may intersect with the first surface 10A, and the second side surface 10D may intersect with the first surface 10A. In one embodiment, referring to FIG. 12, the first side surface 10C and the first surface 10A may be perpendicular to each other, and the second side surface 10D and the first surface 10A may be perpendicular to each other. An extension direction of the first side surface 10C may be the same as the direction Z perpendicular to the plane of the first film layer 10, and an extension direction of the second side surface 10D may be the same as the direction Z perpendicular to the plane of the first film layer 10.

When the flexible second film layer 20 at least partially wraps the rigid first film layer 10, the fourth portion 204 of the second film layer 20 may be located on the side of the first side surface 10C away from the second side surface 10D, and the fifth portion 205 of the second film layer 20 may be located on the side of the second side surface 10D away from the first side surface 10C. The fourth portion 204 may be fixedly attached on the first side surface 10C of the first film layer 10 through the fourth adhesive layer 304, and the fifth portion 205 may be fixedly attached on the second side surface 10D of the first film layer 10 through the fifth adhesive layer 305. In other words, the first portion 201, the second portion 202, the third portion 203, the fourth portion 204, and the fifth portion 205 of the second film layer 20 may be fixedly attached on the first film layer 10 and the third film layer 40 through the corresponding adhesive layers. Therefore, the overall wrapping adhesive layer having the same shape as the second film layer 20 may be formed on the side of the second film layer 20 facing towards the first film layer 10, and the first film layer 10 and the second film layer 20 may form the wrapping attachment structure through the one-piece adhesive layer.

Referring to FIG. 14, in one embodiment, both the first portion 201 of the second film layer 20 and the third film layer 40 bonded by the third adhesive layer 303 may be flexible film layers, and may be used together as the flexible substrate of the subsequently formed flexible module. After the any other film layer structure of the flexible module is formed on the side of the first portion 201 of the prefabricated substrate 00 away from the first film layer 10 (not shown in FIG. 14), mechanical peeling may be directly performed from the gap K between the second portion 202 and the third portion 203 of the prefabricated substrate 00 on the second surface 10B of the first film layer 10, and the laser lift-off process may not be needed, which may facilitate to reduce cost. The functional device structure may not be formed on the side of the second portion 202 and the third portion 203 of the prefabricated substrate 00 away from the first film layer 10, and the deformation may not affect the production yield, such that the gap K may be used as the cut-in point to perform peeling.

There may be no sticky adhesive layer between the first surface of the first film layer 10 and the third film layer 40, which may make it substantially easy to achieve peeling, and may further reduce the difficulty of peeling the subsequently formed flexible module from the rigid first film layer 10. Then, the second portion 202 with the first adhesive layer 301, the third portion 203 with the second adhesive layer 302, the fourth portion 204 with the fourth adhesive layer 304 and the fifth portion 205 with the fifth adhesive layer 305 may be respectively cut along the dashed line M2 in FIG. 14, to obtain the flexible module including the flexible first portion 201 and the flexible third film layer 40 as a flexible substrate. It should be understood that because the first portion 201 of the second film layer 20 is needed when using the prefabricated substrate 00 in the disclosed embodiments to form the flexible module, even if the first adhesive layer 301 and the second adhesive layer 302 are retained on the second surface 10B of the first film layer 10 when performing the mechanical peeling, the use effect of the first portion 201 of the second film layer 20 may not be affected.

Referring to FIG. 15, both the first portion 201 of the second film layer 20 and the third film layer 40 bonded by the third adhesive layer 303 may be flexible film layers, and may be used together as the flexible substrate of the subsequently formed flexible module. After the any other film layer structure of the flexible module is formed on the side of the first portion 201 of the prefabricated substrate 00 away from the first film layer 10 (not shown in FIG. 15), the fourth portion 204 and the fifth portion 205 of the second film layer 20 may be cut along the direction X parallel to the plane of the first film layer 10 (cut along the dashed line N2 as shown in FIG. 15), such that the first portion 201 of the second film layer 20 and the third film layer 40 that are fixedly bonded by the third adhesive layer 303 may be separated from the second portion 202 and the third portion 203 of the second film layer 20.

Because the second portion 202 is attached on the second surface 10B of the first film layer 10 through the first adhesive layer 301, and the third portion 203 is attached on the second surface 10B of the first film layer 10 through the second adhesive layer 302, the rigid first film layer 10 may be separated from the flexible first portion 201 as the second portion 202 and the third portion 203 are separated from the first portion 201. Because there is no adhesive layer between the first portion 201 of the second film layer 20 and the first film layer 10, directly realizing the mechanical peeling may be substantially easy. Further, both the first portion 201 of the second film layer 20 and the third film layer 40 that are bonded by the third adhesive layer 303 may still be bonded, and may be used together as the flexible substrate. Cutting the fourth portion 204 and the fifth portion 205 of the second film layer 20 along the dashed line N2 along the direction X parallel to the plane of the first film layer 10 may not require the use of special cutting equipment, and an ordinary utility knife may be capable of cutting the flexible second film layer 20, such that the flexible module including the flexible first portion 201 and the flexible third film layer 40 may be directly obtained, which may facilitate to reduce the manufacturing cost.

In one embodiment, by disposing the flexible third film layer 40 between the rigid first film layer 10 and the first portion 201 of the second film layer 20, adhesive layers, including the first adhesive layer 301 corresponding to the second portion 202, the second adhesive layer 302 corresponding to the third portion 203, the third adhesive layer 303 corresponding to the first portion 201, the fourth adhesive layer 304 corresponding to the fourth portion 204 and the fifth adhesive layer 305 corresponding to the fifth portion 205, may be disposed on different regions of the second film layer 20 when forming the prefabricated substrate 00. Therefore, there may be no need to dispose adhesive layers for fixedly bonding on different regions of the second film layer 20, and the adhesive layer directly coated on the whole surface of the second film layer 20 may be configured as the corresponding first adhesive layer 301, second adhesive layer 302, third adhesive layer 303, fourth adhesive layer 304, and fifth adhesive layer 305. The first adhesive layer 301, the second adhesive layer 302, the third adhesive layer 303, the fourth adhesive layer 304, and the fifth adhesive layer 305 may be an adhesive layer having a one-piece structure, made of a same material, and formed by a same process.

The third film layer 40 may be attached on the third adhesive layer 303 and the first film layer 10 may be attached on the third film layer 40 over a position corresponding to the first portion 201. The second film layer 20 may partially wrap the first film layer 10 and the third film layer 40 to finish the production of the prefabricated substrate 00. The first film layer 10 may be fixedly bonded to the second film layer 20 through the adhesive layer on the entire surface of the second film layer 20, to enhance the stability of the wrapping effect of the first film layer 10 and the second film layer 20 of the prefabricated substrate 00, and may further enhance the bonding force between the first film layer 10 and the second film layer 20, which may facilitate to suppress the warpage of the film layer. At the same time, coating the adhesive layer on the entire surface of the second film layer 20 may facilitate to simplify the fabrication process of the prefabricated substrate 00, to reduce the fabrication process difficulty, and to improve the manufacturing efficiency.

In certain embodiments, referring to FIG. 12 and FIG. 13, in one embodiment, in the direction Z perpendicular to the plane of the first film layer 10, a thickness D3 of the third film layer 40 may be smaller than the thickness D2 of the second film layer 40.

The present disclosure may explain that to reduce the difficulty of coating the adhesive layer between the second film layer 20 and the first film layer 10 and to simplify the process steps, the third film layer 40 may be disposed between the first portion 201 of the second film layer 20 and the first film layer 10, and the third film layer 40 and the first portion 201 of the second film layer 20 may be together used as a flexible substrate. In certain embodiments, the third film layer 40 may also be used as a protective film layer for subsequently forming the flexible module, and the third film layer 40 as the protective film layer may be peeled after the flexible module is formed. Therefore, in the direction Z perpendicular to the plane of the first film layer 10, the thickness D3 of the third film layer 40 may be smaller than the thickness D2 of the second film layer 20. In other words, when the third film layer 40 is used as a protective film layer, the thickness D3 of the third film layer 40 may be set substantially small. In one embodiment, in the direction Z perpendicular to the plane of the first film layer 10, the thickness D3 of the third film layer 40 may be less than or equal to 50 which may prevent the third film layer 40 from being excessive thick to affect subsequent peeling. Further, subsequently peeling the third film layer 40 as a protective film may be substantially convenient and fast, which may facilitate to improve the manufacturing efficiency.

Figure 16:
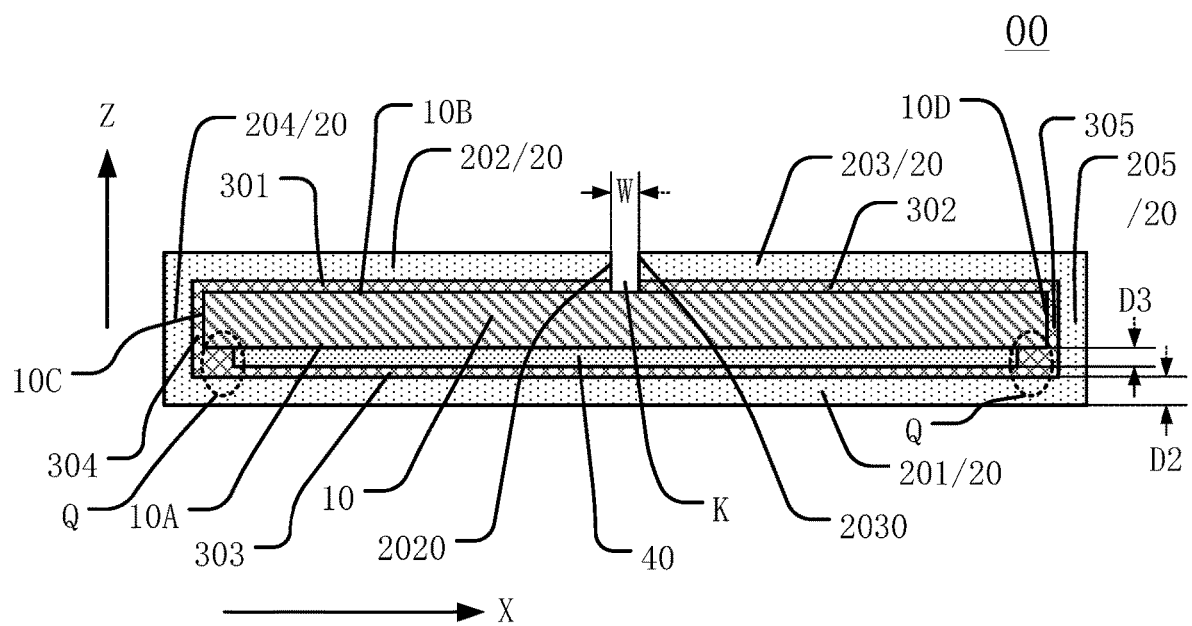
FIG. 16 illustrates a schematic diagram of another exemplary prefabricated substrate consistent with disclosed embodiments of the present disclosure.

FIG. 16 illustrates a schematic diagram of another prefabricated substrate consistent with disclosed embodiments of the present disclosure. In certain embodiments, referring to FIG. 12 and FIG. 16, an orthographic projection of the third film layer 40 on the first portion 201 may be located within the range of the first portion 201. Referring to FIG. 12, an edge of the orthographic projection of the third film layer 40 on the first portion 201 may coincide with an edge of the first portion 201. In another embodiment, an area of the orthographic projection of the third film layer 40 on the first portion 201 may be the same as an area of the first portion 201, and the orthographic projection of the third film layer 40 on the first portion 201 may be located within the range of the first portion 201.

The present disclosure may explain that the size and shape of the flexible third film layer 40 disposed between the first film layer 10 and the first portion 201 of the second film layer 20 may be exactly the same as the size and shape of the first portion 201. In other words, the edge of the orthographic projection of the third film layer 40 on the first portion 201 may coincide with the edge of the first portion 201. In another embodiment, the area of the orthographic projection of the flexible third film layer 40 on the first portion 201 may be smaller than the area of the first portion 201, such that the edge of the first portion 201 of the second film layer 20 facing towards the first film layer 10 (the position circled by the dashed line Q in FIG. 16) may be attached on the first surface 10A through the third adhesive layer 303, which may facilitate to increase the attached area between the first portion 201 of the flexible second film layer 20 and the rigid first film layer 10, and may further facilitate to reduce the risk of peeling of the first portion 201 of the second film layer 20 as a flexible substrate.

Further, in one embodiment, referring to FIG. 16, because the area of the orthographic projection of the flexible third film layer 40 on the first portion 201 is smaller than the area of the first portion 201, when the third adhesive layer 303 is disposed on the side of the first portion 201 of the second film layer 20 facing towards the third film layer 40, at least part of the third adhesive layer 303 may be filled between the first portion 201 and the first film layer 10. In other words, at least part of the third film layer 303 in an uncured state may be fully filled between the edge of the first portion 201 and the first surface 10A of the first film layer 10. Therefore, the reduction of the area of the third film layer 40 may facilitate to increase the attached area of the rigid first film layer 10 and the first portion 201 of the flexible second film layer 20, which may ensure the bonding stability between the rigid first film layer 10 and the first portion 201 of the second film layer 20 as a flexible substrate, and to reduce the risk of peeling.

It should be understood that the difference between the area of the orthographic projection of the flexible third film layer 40 on the first portion 201 and the area of the first portion 201 may be determined according to the size of the first portion 201 of the second film layer 20 as the flexible substrate and the adhesive strength of the third adhesive layer 303, as long as the area at the edge of the first portion 201 of the second film layer 20 is large enough to ensure that the first portion 201 of the second film layer 20 and the first film layer 10 are firmly attached on each other, which may not be limited by the present disclosure.

Figure 17:
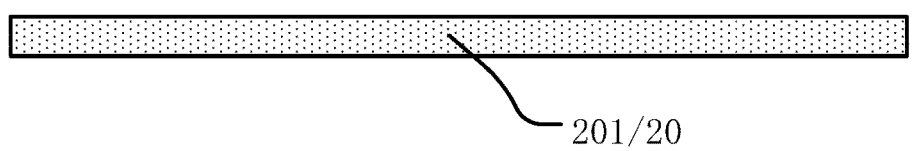
FIG. 17 illustrates a schematic diagram of an exemplary flexible substrate consistent with disclosed embodiments of the present disclosure.
Figure 18:
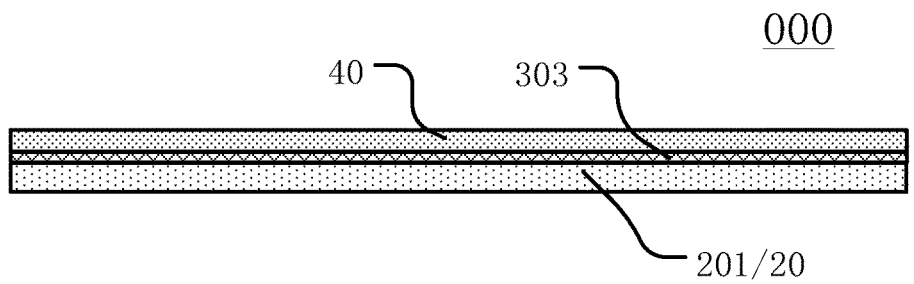
FIG. 18 illustrates a schematic diagram of another exemplary flexible substrate consistent with disclosed embodiments of the present disclosure.

The present disclosure provides a flexible substrate 000. FIG. 17 illustrates a schematic diagram of a flexible substrate consistent with disclosed embodiments of the present disclosure; and FIG. 18 illustrates a schematic diagram of another flexible substrate consistent with disclosed embodiments of the present disclosure. In certain embodiments, referring to FIGS. 7-18, the flexible substrate 000 may be formed using the prefabricated substrate 00 in the above disclosed embodiments. In one embodiment, referring to FIGS. 10-11 and FIG. 17, the flexible substrate 000 formed according to the above-disclosed embodiments may include the first portion 201 of the second film layer 20. In another embodiment, referring to FIGS. 14-15 and FIG. 18, the flexible substrate 000 formed according to the above-disclosed embodiments may include the third film layer 40 and the first portion 201 of the second film layer 20. Using the prefabricated substrate 00 in the above-disclosed embodiments to form the flexible substrate 000 may reduce the fabrication process difficulty, may facilitate to reduce the risk of peeling of the flexible substrate 000 from any other film layer over the flexible substrate 000, and may further improve the yield of flexible modules subsequently fabricated by using the flexible substrate 000. The process and effect of forming the flexible substrate 000 by using the prefabricated substrate 00 in the above-disclosed embodiments may not be repeated, and details may refer to the specific corresponding descriptions in the above-disclosed embodiments, which may not be repeated herein.

Figure 19:
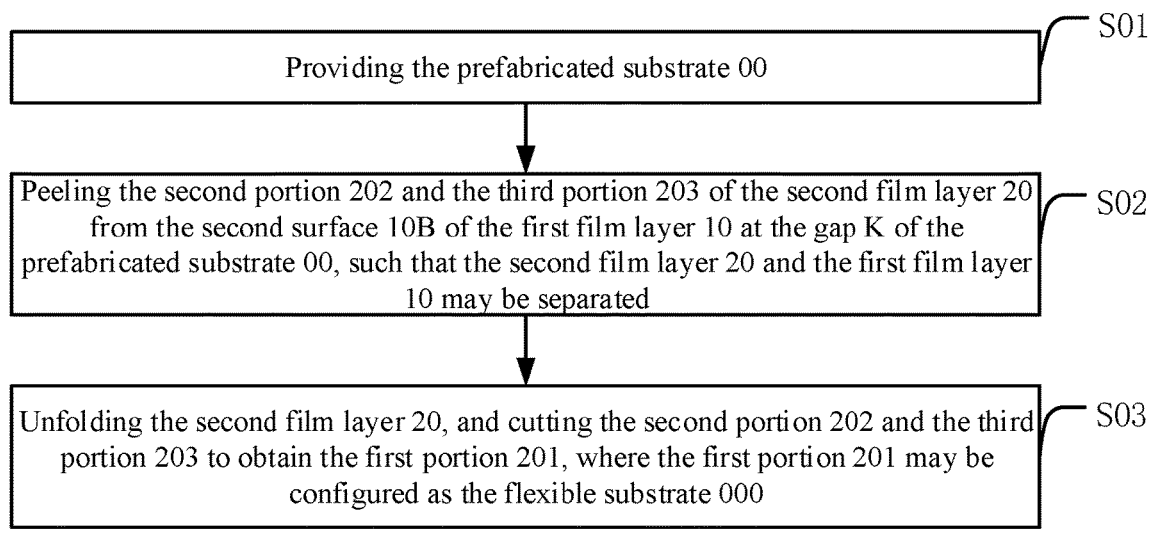
FIG. 19 illustrates a schematic flow chart of an exemplary fabrication method of a flexible substrate consistent with disclosed embodiments of the present disclosure.
Figure 20:
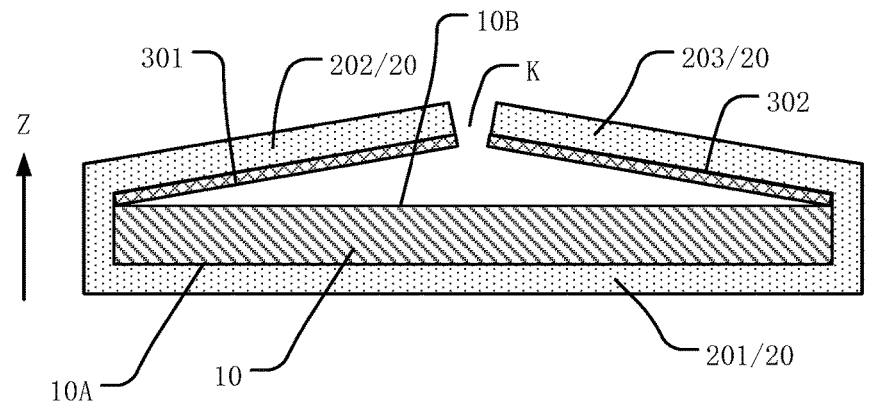
FIG. 20 illustrates a schematic diagram of a semiconductor structure corresponding to a stage of peeling a second portion and a third portion of a second film layer from a second surface of a first film layer in the fabrication method of the flexible substrate in FIG. 19 consistent with disclosed embodiments of the present disclosure.
Figure 21:
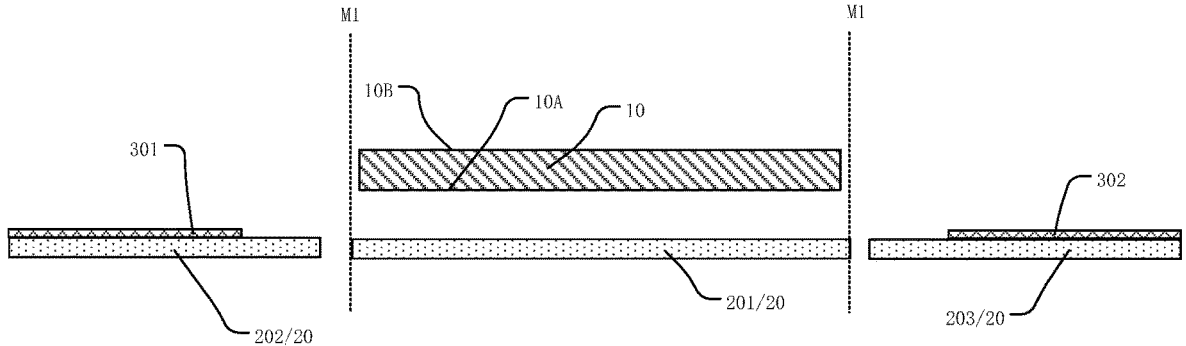
FIG. 21 illustrates a schematic diagram of a semiconductor structure corresponding to a stage of cutting a second portion and a third portion of a second film layer after unfolding the second film layer in the fabrication method of the flexible substrate in FIG. 19 consistent with disclosed embodiments of the present disclosure.

FIG. 19 illustrates a schematic flow chart of a fabrication method of a flexible substrate consistent with disclosed embodiments of the present disclosure; FIG. 20 illustrates a schematic diagram of a semiconductor structure corresponding to a stage of peeling the second portion and the third portion of the second film layer from the second surface of the first film layer in the fabrication method in FIG. 19; and FIG. 21 illustrates a schematic diagram of a semiconductor structure corresponding to a stage of cutting the second portion and the third portion of the second film layer after unfolding the second film layer in the fabrication method in FIG. 19. In certain embodiments, referring to FIG. 7, FIG. 17 and FIGS. 19-21, the fabrication method of the flexible substrate in the disclosed embodiments may be configured to form the flexible substrate in the embodiment associated with FIG. 17. The fabrication method of the flexible substrate may include following.

S01: providing the prefabricated substrate 00 in any one of the above-disclosed embodiments. In one embodiment, the provided prefabricated substrate 00 may be the prefabricated substrate 00 in the embodiment associated with FIG. 7 as an example for illustration.

S02: peeling the second portion 202 and the third portion 203 of the second film layer 20 from the second surface 10B of the first film layer 10 at the gap K of the prefabricated substrate 00, such that the second film layer 20 and the first film layer 10 may be separated, as shown in FIG. 20.

S03: unfolding the second film layer 20, and cutting the second portion 202 and the third portion 203 along the dashed line M1 (as shown in FIG. 21) to obtain the first portion 201, where the first portion 201 may be configured as the flexible substrate 000, as shown in FIG. 17.

The disclosed embodiments may explain a fabrication method of a flexible substrate 000 using the prefabricated substrate 00 shown in FIG. 7. The second portion 202 and the third portion 203 of the second film layer 20 may be peeled from the second surface 10B of the first film layer 10 at the gap K between the second portion 202 and the third portion 203 of the second film layer 20 over the second surface 10B of the first film layer 10. In one embodiment, the first adhesive layer 301 and the second adhesive layer 302 may include a mechanical peeling adhesive, and a UV dissociative adhesive (photosensitive adhesive). In one embodiment, peeling the second portion 202 and the third portion 203 of the second film layer 20 from the second surface 10B of the first film layer 10 may include one of a mechanical peeling and a laser lift-off.

If the direct mechanical peeling method is adopted, the laser lift-off process may not be needed, which may facilitate to reduce cost. The functional device structure may not be formed on the side of the second portion 202 and the third portion 203 of the prefabricated substrate 00 away from the first film layer 10, and the deformation may not affect the production yield, such that the gap K may be used as the cut-in point to perform peeling. There may be no sticky adhesive layer between the first portion 201 of the second film layer 20 and the first film layer 10, which may make it substantially easy to achieve peeling. In other words, after peeling, the second film layer 20 and the first film layer 10 may be separated. Then, the second film layer 20 may be unfolded, such that the second film layer 20 may be in a flattened state. The second portion 202 with the first adhesive layer 301 and the third portion 203 with the second adhesive layer 302 may be cut, to obtain the first portion 201. The first portion 201 may be the formed flexible substrate 000.

If the laser lift-off method is adopted, laser scanning may be used to make molecular chains of the first adhesive layer 301 between the second portion 202 and the first film layer 10 and the second adhesive layer 302 between the third portion 203 and the first film layer 10 be broken, such that the viscosity of the first adhesive layer 301 and the second adhesive layer 302 may be weakened, to separate the second portion 202 from the first film layer 10 and to separate the third portion 203 from the first film layer 10. Because there is no fixed adhesive layer between the first portion 201 and the first surface 10A of the first film layer 10, the first portion 201 may be directly separated from the first film layer 10. Then, the second film layer 20 may be unfolded, such that the second film layer 20 may be in a flattened state. The second portion 202 with the first adhesive layer 301 and the third portion 203 with the second adhesive layer 302 may be cut, to obtain the first portion 201. The first portion 201 may be the formed flexible substrate 000.

In one embodiment, the method for forming the flexible substrate 000 by using the prefabricated substrate 00 may not only avoid warpage through the double-sided attachment effect of first film layer 10 and the second film layer 20, but also facilitate to resolve the peeling problem of the flexible substrate 000 when subsequently using the prefabricated substrate 00 to form a flexible module. Further, in the subsequent process of peeling the first film layer 10 from the second film layer 20, the rigid film layer of the prefabricated substrate 00 may not need to be cut, such that the rigid first film layer 10 may be reused, which may not only reduce the cost, but also maximize the use of the large area of the first film layer 10 and the second film layer 20. Therefore, the effective area of the formed flexible substrate may be large enough, and the cost may be saved while ensuring the production yield.

FIG. 22 illustrates a schematic flow chart of another fabrication method of a flexible substrate consistent with disclosed embodiments of the present disclosure; FIG. 23 illustrates a schematic diagram of a semiconductor structure corresponding to a stage of peeling the second portion and the third portion of the second film layer from the second surface of the first film layer in the fabrication method in FIG. 22; and FIG. 24 illustrates a schematic diagram of a semiconductor structure corresponding to a stage of cutting the second portion and the third portion of the second film layer after unfolding the second film layer in the fabrication method in FIG. 22. In certain embodiments, referring to FIG. 12, FIG. 18, and FIGS. 22-24, the fabrication method of the flexible substrate in the disclosed embodiments may be configured to form the flexible substrate in the embodiment associated with FIG. 18. The fabrication method of the flexible substrate may include following.

S11: providing the prefabricated substrate 00 in any one of the above-disclosed embodiments. In one embodiment, the provided prefabricated substrate 00 may be the prefabricated substrate 00 in the embodiment associated with FIG. 12 as an example for illustration. In other words, the provided prefabricated substrate 00 may further include a third film layer 40. The third film layer 40 may be disposed between the first film layer 10 and the first portion 201 of the second film layer 20, and the third film layer 40 may be a flexible film layer. The third film layer 40 may be attached on the first portion 201 of the second film layer 20 through the third adhesive layer 303, and the third film layer 40 may be in direct contact with the first surface 10A of the first film layer 10. In one embodiment, the second film layer 20 may further include the fourth portion 204 and the fifth portion 205. The first film layer 10 may further include the first side surface 10C and the second side surface 10D that are disposed opposite to each other. The fourth portion 204 may be attached on the first side surface 10C of the first film layer 10 through the fourth adhesive layer 304, and the fifth portion 205 may be attached on the second side surface 10D of the first film layer 10 through the fifth adhesive layer 305. In other words, the second film layer 20 may partially wrap the first film layer 10 through the adhesive layer formed on the whole surface of the second film layer. The beneficial effect of the adhesive layer formed on the whole surface of the second film layer may be understood with reference to the corresponding embodiment associated with FIG. 12, which may not be repeated herein.

S12: peeling the second portion 202 and the third portion 203 of the second film layer 20 from the second surface 10B of the first film layer 10 at the gap K of the prefabricated substrate 00, such that the second film layer 20 and the first film layer 10 may be separated, as shown in FIG. 23.

S03: unfolding the second film layer 20, and cutting the second portion 202 and the third portion 203 along the dashed line M2 (as shown in FIG. 24) to obtain the stacked first portion 201 and the third film layer 40, where the first portion 201 and the third film layer 40 may be configured as the flexible substrate 000, as shown in FIG. 18.

The disclosed embodiments may explain a fabrication method of a flexible substrate 000 using the prefabricated substrate 00 shown in FIG. 12. The second portion 202 and the third portion 203 of the second film layer 20 may be peeled from the second surface 10B of the first film layer 10 at the gap K between the second portion 202 and the third portion 203 of the second film layer 20 over the second surface 10B of the first film layer 10, such that the second film layer 20 and the third film layer 40 may be separated from the first film layer 10. In one embodiment, the first adhesive layer 301 and the second adhesive layer 302 may include a mechanical peeling adhesive, and a UV dissociative adhesive (photosensitive adhesive). In one embodiment, peeling the second portion 202 and the third portion 203 of the second film layer 20 from the second surface 10B of the first film layer 10 may include one of a mechanical peeling and a laser lift-off.

If the direct mechanical peeling method is adopted, the laser lift-off process may not be needed, which may facilitate to reduce cost. The functional device structure may not be formed on the side of the second portion 202 and the third portion 203 of the prefabricated substrate 00 away from the first film layer 10, and the deformation may not affect the production yield, such that the gap K may be used as the cut-in point to perform peeling. There may be no sticky adhesive layer between the third film layer 40 and the first surface 10A of the first film layer 10, which may make it substantially easy to achieve peeling. Therefore, the first portion attached on the third film layer 40 may be directly separated from the first film layer 10. In other words, after peeling, the second film layer 20 and the third film layer 40 may be separated from the first film layer 10. Then, the second film layer 20 may be unfolded, such that the second film layer 20 may be in a flattened state. The second portion 202 with the first adhesive layer 301 and the third portion 203 with the second adhesive layer 302 may be cut, to obtain the stacked first portion 201 and the third film layer 40. The first portion 201 and the third film layer 40 that are boned through the third adhesive layer 303 may be the formed flexible substrate 000.

If the laser lift-off method is adopted, laser scanning may be used to make molecular chains of the first adhesive layer 301 between the second portion 202 and the first film layer 10, the second adhesive layer 302 between the third portion 203 and the first film layer 10, the fourth adhesive layer 304 between the fourth portion 204 and the first side surface 10C of the first film layer 10, and the fifth adhesive layer 305 between the fifth portion 205 and the second side surface 10D of the first film layer 10 be broken, such that the viscosity of the first adhesive layer 301, the second adhesive layer 302, the fourth adhesive layer 304 and the fifth adhesive layer 305 may be weakened, to separate the second portion 202 from the first film layer 10, and to separate the third portion 203 from the first film layer 10. Because there is no fixed adhesive layer between the third film layer 40 and the first surface 10A of the first film layer 10, the third film layer 40 may be directly separated from the first film layer 10. Then, the second film layer 20 attached with the third film layer 40 may be unfolded, such that the second film layer 20 may be in a flattened state. The second portion 202 with the first adhesive layer 301, the third portion 203 with the second adhesive layer 302, the fourth portion 204 with the fourth adhesive layer 304, and the fifth portion 205 with the fifth adhesive layer 305 may be cut, to obtain the stacked first portion 201 and the third film layer 40. The first portion 201 and the third film layer 40 that are boned through the third adhesive layer 303 may be the formed flexible substrate 000.

In one embodiment, the method for forming the flexible substrate 000 by using the prefabricated substrate 00 may not only avoid warpage through the double-sided attachment effect of first film layer 10 and the second film layer 20, but also facilitate to resolve the peeling problem of the flexible substrate 000 when subsequently using the prefabricated substrate 00 to form a flexible module. Further, the second film layer 20 may warp part of the first film layer 10 through the adhesive layer formed on the entire surface of the second film layer 20, which may facilitate to reduce the fabrication difficulty of the prefabricated substrate 00. In the subsequent process of peeling the first film layer 10 from the second film layer 20, the rigid film layer of the prefabricated substrate 00 may not need to be cut, such that the rigid first film layer 10 may be reused, which may not only reduce the cost, but also maximize the use of the large area of the first film layer 10 and the second film layer 20. Therefore, the effective area of the formed flexible substrate may be large enough, and the cost may be saved while ensuring the production yield.

In one embodiment, when the mechanical peeling method is used to peel the second portion 202 and the third portion 203 of the second film layer 20 from the second surface 10B of the first film layer 10, the peeling strength of the first adhesive layer 301 and/or the second adhesive layer 302 with respect to the first film layer 10 may be in a range of approximately 3 g/25 mm-50 g/25 mm. The peeling strength may refer to the maximum force required to peel a unit width from the contact surface of the materials that are bonded together. Therefore, while ensuring that the second portion 202 and the third portion 203 are substantially quickly peeled from the second surface 10B of the first film layer 10, the power consumption of peeling may be saved.

In one embodiment, when the laser lift-off method is used to peel the second portion 202 and the third portion 203 of the second film layer 20 from the second surface 10B of the first film layer 10, both the first adhesive layer 301 and the second adhesive layer 302 may be a photosensitive adhesive, such as a UV dissociative adhesive. Before the laser lift-off is performed, in other words, after the prefabricated substrate 00 is formed, the peeling strength of the first adhesive layer 301 and the second adhesive layer 302 with respect to the first film layer 10 may be greater than 1000 g/25 mm, which may ensure the bonding stability of the first film layer 10 and the second film layer 20 of the prefabricated substrate 00, and may avoid the warpage and peeling problem of the film layer when forming the any other film layer on the prefabricated substrate 00. After being irradiated by laser, in other words, during laser lift-off, the peeling strength of the first adhesive layer 301 and the second adhesive layer 302 with respect to the first film layer 10 may gradually decrease, and may be reduced to less than 5 g/25 mm. The viscosity of the first adhesive layer 301 and the second adhesive layer 302 may be weakened, which may ensure that the second portion 202 and the third portion 203 are substantially quickly peeled from the second surface 10B of the first film layer 10. Therefore, while ensuring the stability of film layer of the prefabricated substrate 00, it may be ensured that the second portion 202 and the third portion 203 may be smoothly peeled from the second surface 10B of the first film layer 10 when performing the laser lift-off, and power consumption of peeling may be saved.

FIG. 25 illustrates a schematic flow chart of another fabrication method of a flexible substrate consistent with disclosed embodiments of the present disclosure; and FIG. 26 illustrates a schematic diagram of a semiconductor structure corresponding to a stage of separating the second portion, the third portion and the first film layer from the first portion in the fabrication method in FIG. 25. In certain embodiments, referring to FIG. 7, FIG. 11, FIG. 17 and FIGS. 25-26, the fabrication method of the flexible substrate in the disclosed embodiments may be configured to form the flexible substrate in the embodiment associated with FIG. 17. The fabrication method of the flexible substrate may include following.

S21: providing the prefabricated substrate 00 in any one of the above-disclosed embodiments. In one embodiment, the provided prefabricated substrate 00 may be the prefabricated substrate 00 in the embodiment associated with FIG. 7 as an example for illustration. In the provided prefabricated substrate 00, the first film layer 10 may include the first side surface 10C and the second side surface 10D that are disposed opposite to each other. The first side surface 10C may intersect with the first surface 10A, and the second side surface 10D may intersect with the first surface 10A. In one embodiment, referring to FIG. 11, the first side surface 10C and the first surface 10A may be perpendicular to each other, and the second side surface 10D and the first surface 10A may be perpendicular to each other. An extension direction of the first side surface 10C may be the same as the direction Z perpendicular to the plane of the first film layer 10, and an extension direction of the second side surface 10D may be the same as the direction Z perpendicular to the plane of the first film layer 10, as shown in FIG. 7 and FIG. 11.

S22: at the positions of the first side surface 10C and the second side surface 10D, cutting the second film layer 20 along the dashed line N1 along the direction X parallel to the plane of the first film layer 10, such that the second portion 202, the third portion 203, and the first film layer 10 may be separated from the first portion 201, as shown in FIG. 26.

S23: configuring the obtained first portion 201 as the flexible substrate 000, as shown in FIG. 17.

The disclosed embodiments may explain a fabrication method of a flexible substrate 000 using the prefabricated substrate 00 shown in FIG. 7. The fabrication method of the flexible substrate 000 in the disclosed embodiments may not require a peeling process, and the second film layer 20 may be directly cut along the direction X parallel to the plane of the first film layer 10 (cut along the dashed line N1 as shown in FIG. 11), such that the first portion 201 of the second film layer 20 may be separated from the second portion 202 and the third portion 203 thereof. Because the second portion 202 is attached on the second surface 10B of the first film layer 10 through the first adhesive layer 301, and the third portion 203 is attached on the second surface 10B of the first film layer 10 through the second adhesive layer 302, the rigid first film layer 10 may be separated from the flexible first portion 201 as the second portion 202 and the third portion 203 are separated from the first portion 201. Because there is no adhesive layer between the first portion 201 of the second film layer 20 and the first film layer 10, directly realizing the mechanical peeling may be substantially easy. Further, cutting the second film layer 20 along the dashed line N1 along the direction X parallel to the plane of the first film layer 10 may not require the use of special cutting equipment, and an ordinary utility knife may be capable of cutting the flexible second film layer 20, such that the flexible substrate 000 including the first portion 201 may be directly obtained, which may facilitate to improve the process efficiency and reduce the manufacturing cost.

Figure 28:
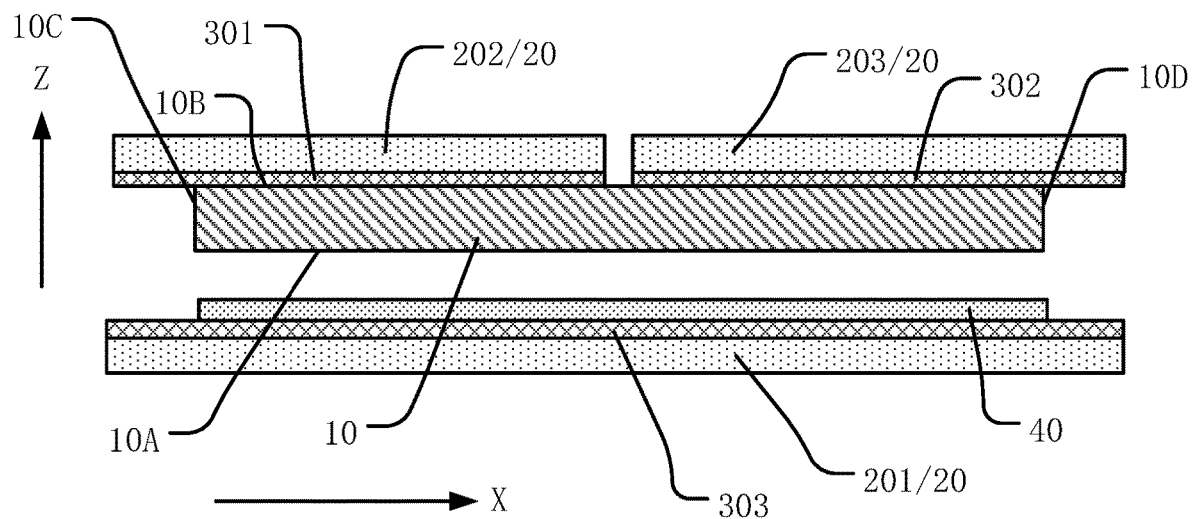
FIG. 28 illustrates a schematic diagram of a semiconductor structure corresponding to a stage of separating a second portion, a third portion and a first film layer from a third film layer in the fabrication method of the flexible substrate in FIG. 27 consistent with disclosed embodiments of the present disclosure.

FIG. 27 illustrates a schematic flow chart of another fabrication method of a flexible substrate consistent with disclosed embodiments of the present disclosure; and FIG. 28 illustrates a schematic diagram of a semiconductor structure corresponding to a stage of separating the second portion, the third portion and the first film layer from the third film layer in the fabrication method in FIG. 27. In certain embodiments, referring to FIG. 12, FIG. 15, FIG. 18 and FIGS. 27-28, the fabrication method of the flexible substrate in the disclosed embodiments may be configured to form the flexible substrate in the embodiment associated with FIG. 18. The fabrication method of the flexible substrate may include following.

S31: providing the prefabricated substrate 00 in any one of the above-disclosed embodiments. In one embodiment, the provided prefabricated substrate 00 may be the prefabricated substrate 00 in the embodiment associated with FIG. 12 as an example for illustration. In the provided prefabricated substrate 00, the first film layer 10 may include the first side surface 10C and the second side surface 10D that are disposed opposite to each other. The first side surface 10C may intersect with the first surface 10A, and the second side surface 10D may intersect with the first surface 10A. In one embodiment, referring to FIG. 12, the first side surface 10C and the first surface 10A may be perpendicular to each other, and the second side surface 10D and the first surface 10A may be perpendicular to each other. An extension direction of the first side surface 10C may be the same as the direction Z perpendicular to the plane of the first film layer 10, and an extension direction of the second side surface 10D may be the same as the direction Z perpendicular to the plane of the first film layer 10. The provided prefabricated substrate 00 may further include the third film layer 40. The third film layer 40 may be disposed between the first film layer 10 and the first portion 201 of the second film layer 20, and the third film layer 40 may be a flexible film layer. The third film layer 40 may be attached on the first portion 201 of the second film layer 20 through the third adhesive layer 303, and the third film layer 40 may be in direct contact with the first surface 10A of the first film layer 10, as shown in FIG. 12 and FIG. 15. In other words, the second film layer 20 may partially wrap the first film layer 10 through the adhesive layer formed on the whole surface of the second film layer. The beneficial effect of the adhesive layer formed on the whole surface of the second film layer may be understood with reference to the corresponding embodiment associated with FIG. 12, which may not be repeated herein.

S32: at the positions of the first side surface 10C and the second side surface 10D, cutting the second film layer 20 along the dashed line N2 along the direction X parallel to the plane of the first film layer 10, such that the second portion 202, the third portion 203, and the first film layer 10 may be separated from the first portion 201, as shown in FIG. 28. It should be understood that the second film layer 20 exceeds the range of the first film layer 10 in the direction X parallel to the plane of the first film layer 10 may refer to the fourth portion 204 and the fifth portion 205 which are flattened after being cut along the dashed line N2.

S33: obtaining the stacked first portion 201 and the third film layer 40, and the first portion 201 and the third film layer 40 may be configured as the flexible substrate 000, as shown in FIG. 18.

The disclosed embodiments may explain a fabrication method of a flexible substrate 000 using the prefabricated substrate 00 shown in FIG. 12. The second film layer 20 may warp part of the first film layer 10 through the adhesive layer formed on the entire surface of the second film layer 20, which may facilitate to reduce the fabrication difficulty of the prefabricated substrate 00. The fabrication method of the flexible substrate 000 in the disclosed embodiments may not require a peeling process, and the second film layer 20 may be directly cut along the direction X parallel to the plane of the first film layer 10 (cut along the dashed line N2 as shown in FIG. 15), such that the first portion 201 of the second film layer 20 attached with the third film layer 40 may be separated from the second portion 202 and the third portion 203 thereof. Because the second portion 202 is attached on the second surface 10B of the first film layer 10 through the first adhesive layer 301, and the third portion 203 is attached on the second surface 10B of the first film layer 10 through the second adhesive layer 302, the rigid first film layer 10 may be separated from the flexible third film layer 40 as the second portion 202 and the third portion 203 are separated from the first portion 201. Because there is no adhesive layer between the third film layer 40 and the first film layer 10, directly realizing the mechanical peeling may be substantially easy. Further, cutting the second film layer 20 along the dashed line N2 along the direction X parallel to the plane of the first film layer 10 may not require the use of special cutting equipment, and an ordinary utility knife may be capable of cutting the flexible second film layer 20, such that the flexible substrate 000 including the first portion 201 and the third film layer 40 may be directly obtained, which may facilitate to improve the process efficiency and reduce the manufacturing cost.

Figure 29:
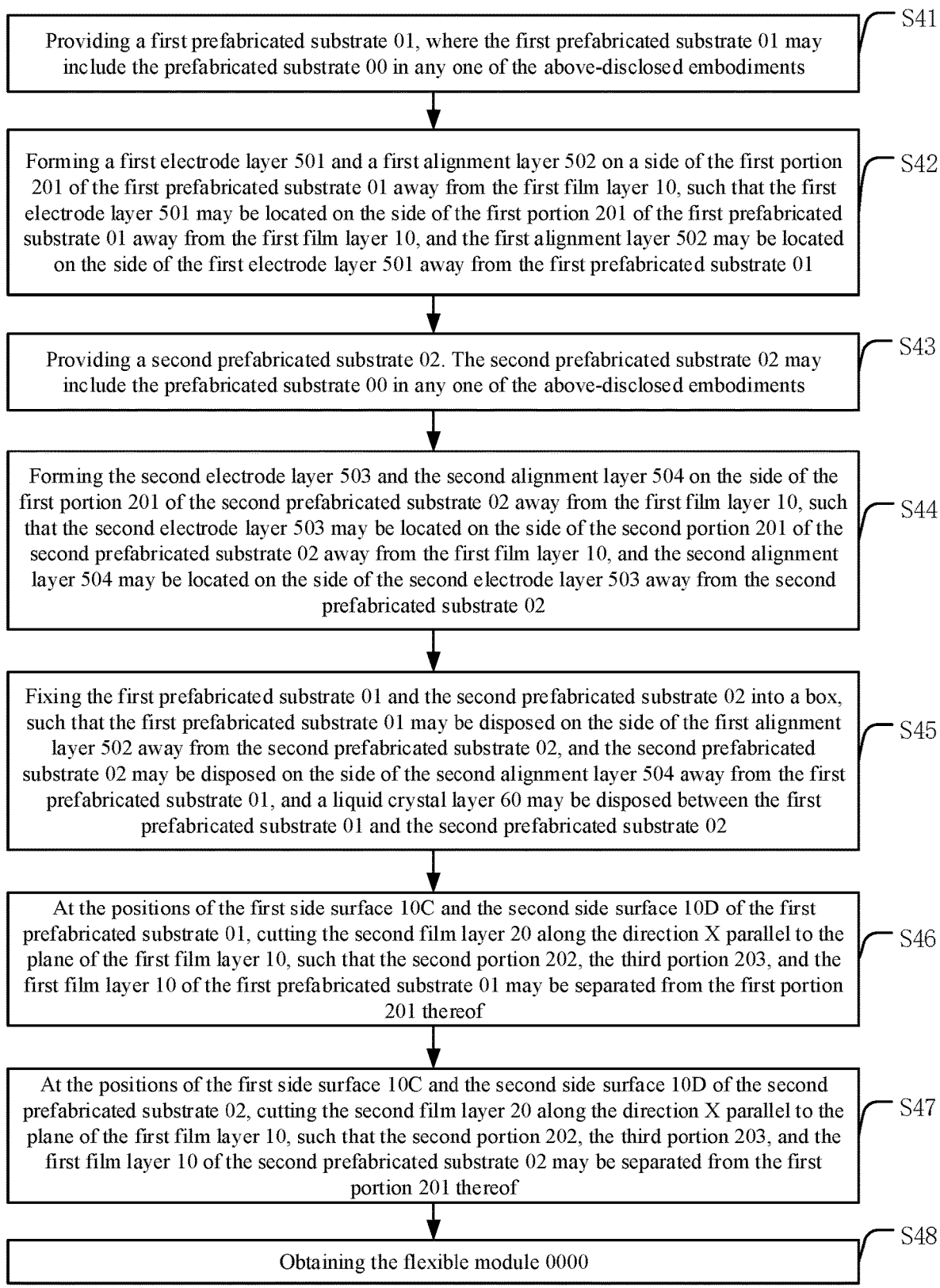
FIG. 29 illustrates a schematic flow chart of an exemplary fabrication method of a flexible module consistent with disclosed embodiments of the present disclosure.
Figure 30:
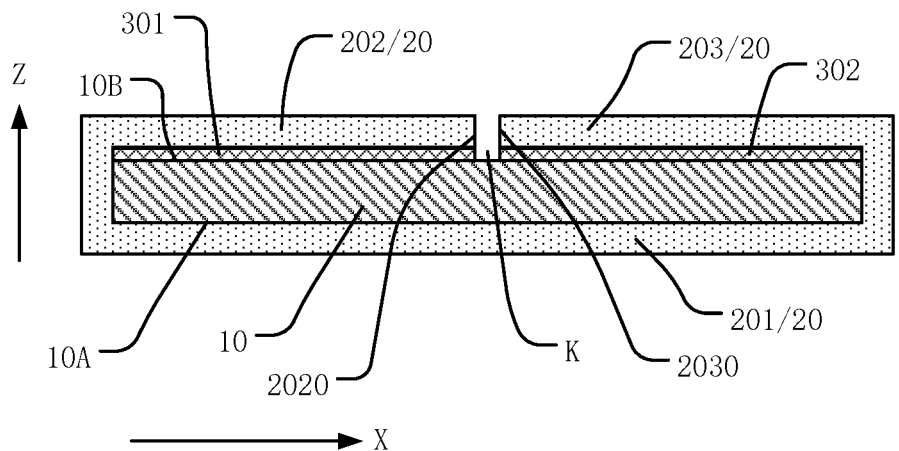
FIG. 30 illustrates a schematic diagram of a semiconductor structure corresponding to a stage of providing a first prefabricated substrate in the fabrication method of the flexible module in FIG. 29 consistent with disclosed embodiments of the present disclosure.
Figure 31:
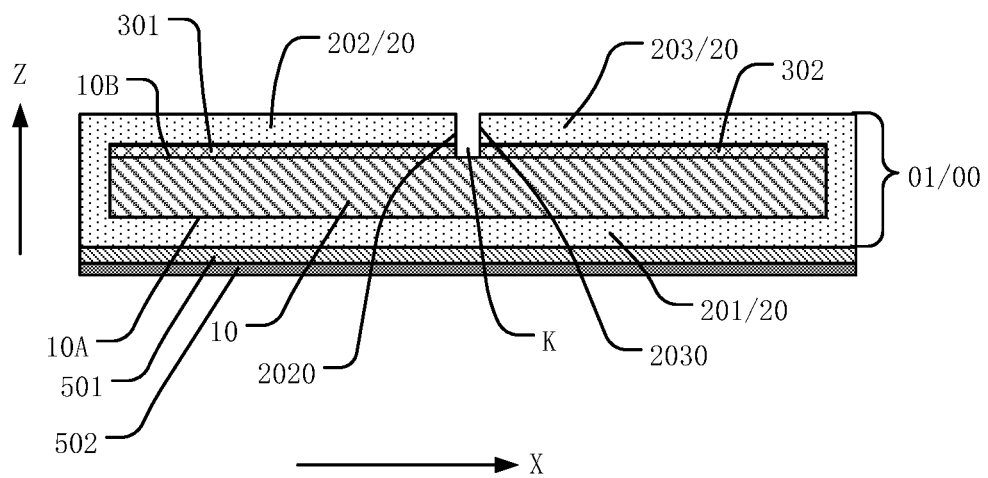
FIG. 31 illustrates a schematic diagram of a semiconductor structure corresponding to a stage of forming a first electrode layer and a first alignment layer on one side of the first prefabricated substrate in the fabrication method of the flexible module in FIG. 29 consistent with disclosed embodiments of the present disclosure.
Figure 32:
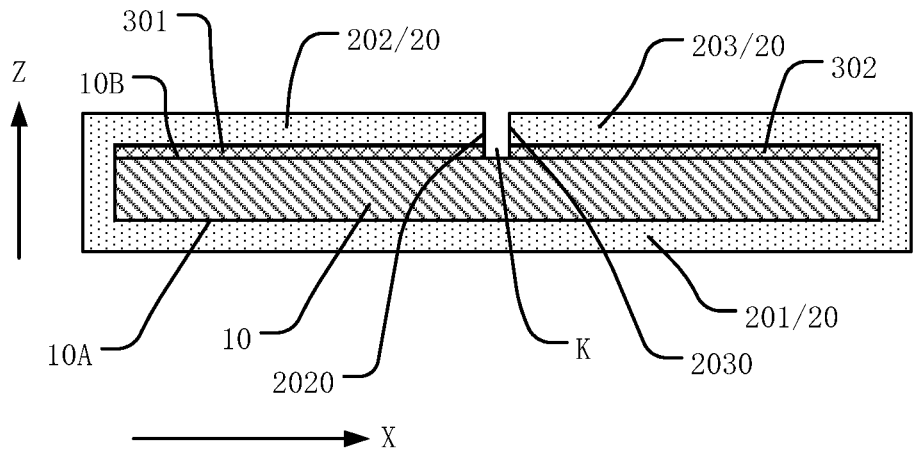
FIG. 32 illustrates a schematic diagram of a semiconductor structure corresponding to a stage of providing a second prefabricated substrate in the fabrication method of the flexible module in FIG. 29 consistent with disclosed embodiments of the present disclosure.
Figure 33:
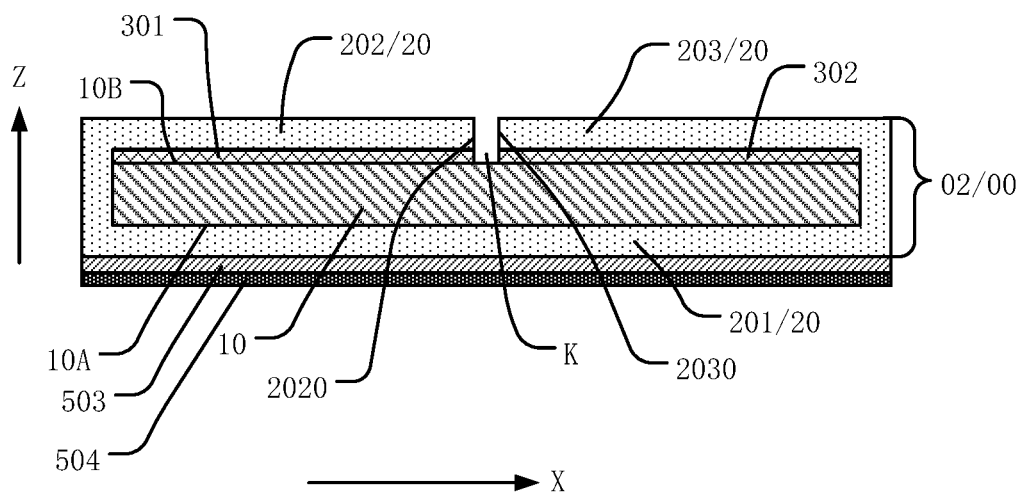
FIG. 33 illustrates a schematic diagram of a semiconductor structure corresponding to a stage of forming a second electrode layer and a second alignment layer on one side of the second prefabricated substrate in the fabrication method of the flexible module in FIG. 29 consistent with disclosed embodiments of the present disclosure.
Figure 34:
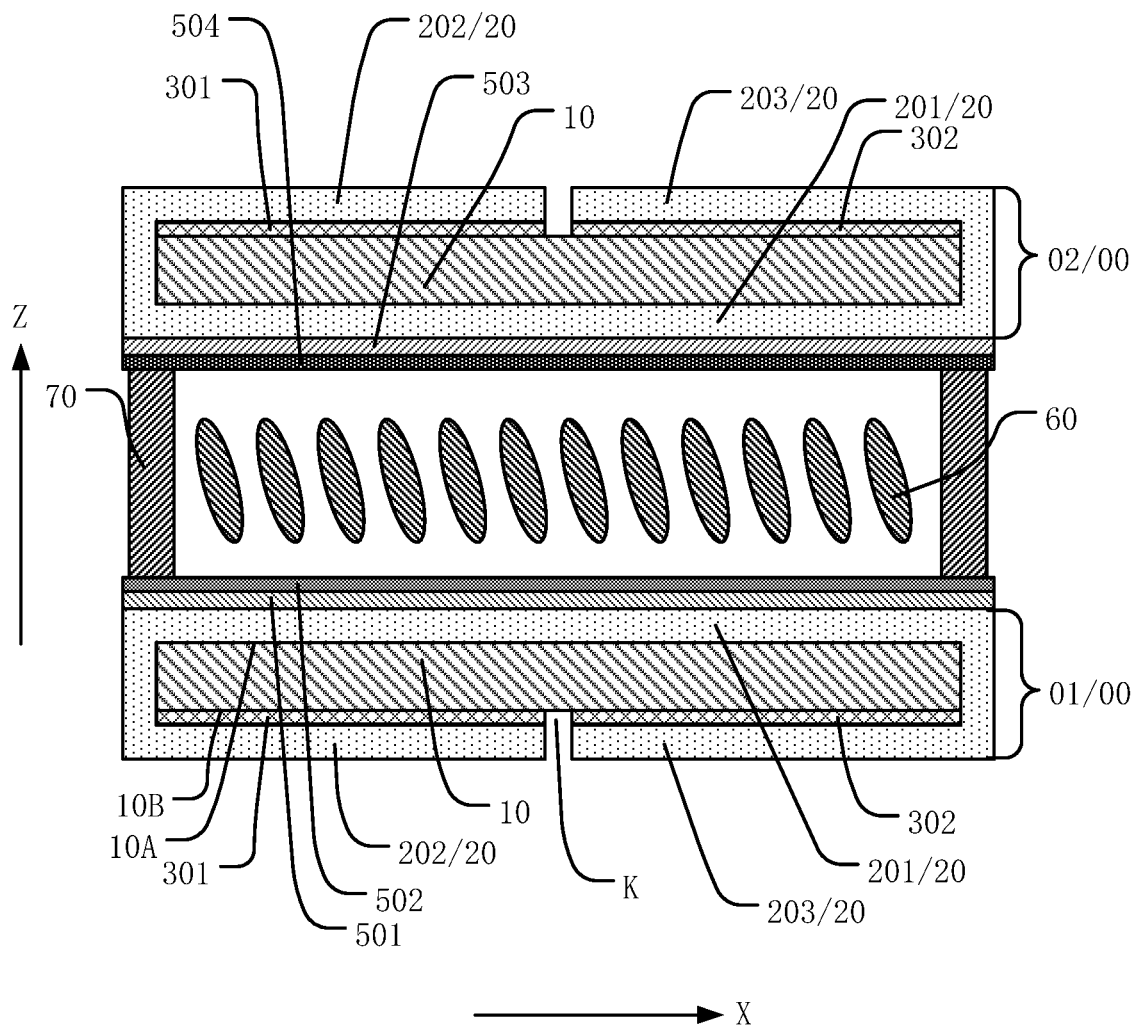
FIG. 34 illustrates a schematic diagram of a semiconductor structure corresponding to a stage of fixing the first prefabricated substrate and the second prefabricated substrate in a box in the fabrication method of the flexible module in FIG. 29 consistent with disclosed embodiments of the present disclosure.
Figure 35:
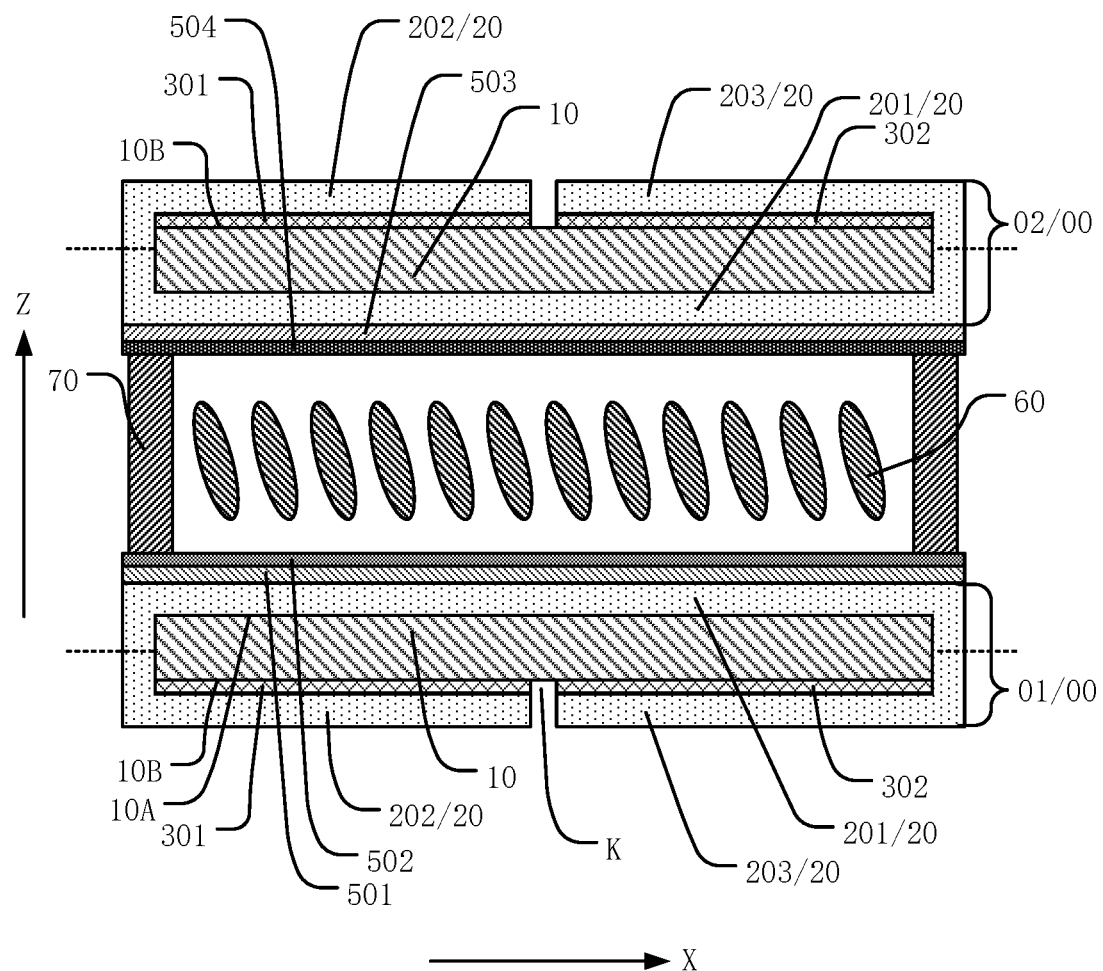
FIG. 35 illustrates a schematic diagram of a semiconductor structure corresponding to a stage of separating the first portion from the first film layer of each of the first prefabricated substrate and the second prefabricated substrate in the fabrication method of the flexible module in FIG. 29 consistent with disclosed embodiments of the present disclosure.
Figure 36:
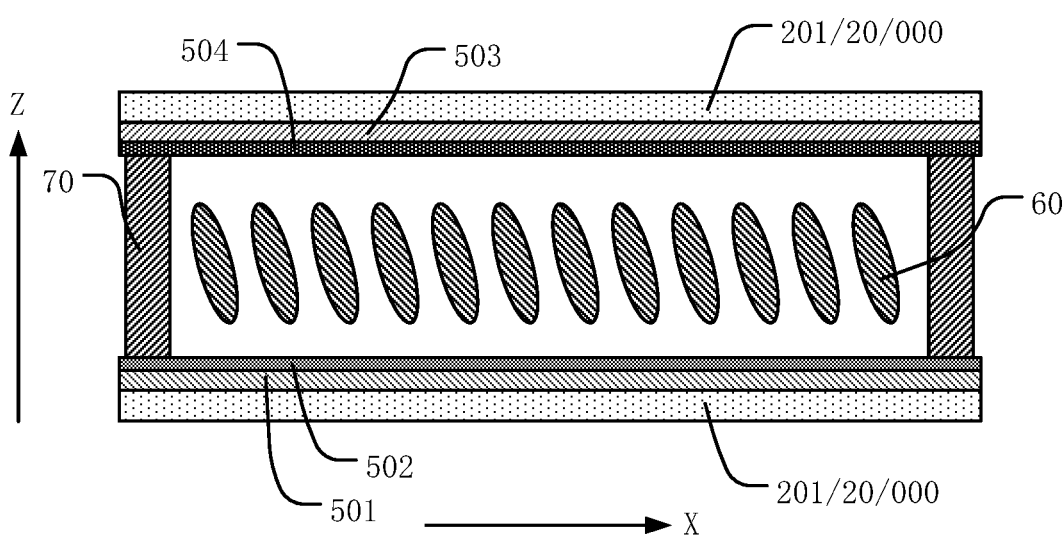
FIG. 36 illustrates a schematic diagram of a semiconductor structure corresponding to a stage of obtaining a flexible module in the fabrication method of the flexible module in FIG. 29 consistent with disclosed embodiments of the present disclosure.

FIG. 29 illustrates a schematic flow chart of a fabrication method of a flexible module consistent with disclosed embodiments of the present disclosure; FIG. 30 illustrates a schematic diagram of a semiconductor structure corresponding to a stage of providing a first prefabricated substrate in the fabrication method in FIG. 29; FIG. 31 illustrates a schematic diagram of a semiconductor structure corresponding to a stage of forming a first electrode layer and a first alignment layer on one side of the first prefabricated substrate in the fabrication method in FIG. 29; FIG. 32 illustrates a schematic diagram of a semiconductor structure corresponding to a stage of providing a second prefabricated substrate in the fabrication method in FIG. 29; FIG. 33 illustrates a schematic diagram of a semiconductor structure corresponding to a stage of forming a second electrode layer and a second alignment layer on one side of the second prefabricated substrate in the fabrication method in FIG. 29; FIG. 34 illustrates a schematic diagram of a semiconductor structure corresponding to a stage of fixing the first prefabricated substrate and the second prefabricated substrate into a box in the fabrication method in FIG. 29; FIG. 35 illustrates a schematic diagram of a semiconductor structure corresponding to a stage of separating the first portion from the first film layer of each of the first prefabricated substrate and the second prefabricated substrate in the fabrication method in FIG. 29; and FIG. 36 illustrates a schematic diagram of a semiconductor structure corresponding to a stage of obtaining the flexible module in the fabrication method in FIG. 29. In certain embodiments, referring to FIGS. 7-16 and FIGS. 29-36, in the fabrication method of the flexible module 0000, the prefabricated substrate 00 in the above-disclosed embodiments may be used. The fabrication method of the flexible module 0000 may include following.

S41: providing a first prefabricated substrate 01. The first prefabricated substrate 01 may include the prefabricated substrate 00 in any one of the above-disclosed embodiments, as shown in FIG. 30. In one embodiment, the first prefabricated substrate 01 may be the prefabricated substrate 00 in the embodiment associated with FIG. 7 as an example for illustration. In specification implementation, the first prefabricated substrate 01 for forming the flexible module 0000 may be the prefabricated substrate in the embodiment associated with FIG. 12. Details may refer to corresponding descriptions in the above-disclosed embodiments, which may not be repeated herein.

S42: forming a first electrode layer 501 and a first alignment layer 502 on a side of the first portion 201 of the first prefabricated substrate 01 away from the first film layer 10, such that the first electrode layer 501 may be located on the side of the first portion 201 of the first prefabricated substrate 01 away from the first film layer 10, and the first alignment layer 502 may be located on the side of the first electrode layer 501 away from the first prefabricated substrate 01, as shown in FIG. 31.

S43: providing a second prefabricated substrate 02. The second prefabricated substrate 02 may include the prefabricated substrate 00 in any one of the above-disclosed embodiments, as shown in FIG. 32. In one embodiment, the second prefabricated substrate 02 may be the prefabricated substrate 00 in the embodiment associated with FIG. 7 as an example for illustration. In specification implementation, the second prefabricated substrate 02 for forming the flexible module 0000 may be the prefabricated substrate in the embodiment associated with FIG. 12. Details may refer to corresponding descriptions in the above-disclosed embodiments, which may not be repeated herein.

S44: forming the second electrode layer 503 and the second alignment layer 504 on the side of the first portion 201 of the second prefabricated substrate 02 away from the first film layer 10, such that the second electrode layer 503 may be located on the side of the second portion 201 of the second prefabricated substrate 02 away from the first film layer 10, and the second alignment layer 504 may be located on the side of the second electrode layer 503 away from the second prefabricated substrate 02, as shown in FIG. 33. In each of the first prefabricated substrate 01 and the second prefabricated substrate 02, the first film layer 10 may include the first side surface 10C and the second side surface 10D that are disposed opposite to each other. The first side surface 10C may intersect with the first surface 10A, and the second side surface 10D may intersect with the first surface 10A. Referring to FIG. 11, the first side surface 10C and the first surface 10A may be perpendicular to each other, and the second side surface 10D and the first surface 10A may be perpendicular to each other. An extension direction of the first side surface 10C may be the same as the direction Z perpendicular to the plane of the first film layer 10, and an extension direction of the second side surface 10D may be the same as the direction Z perpendicular to the plane of the first film layer 10.

S45: fixing the first prefabricated substrate 01 and the second prefabricated substrate 02 into a box, such that the first prefabricated substrate 01 may be disposed on the side of the first alignment layer 502 away from the second prefabricated substrate 02, and the second prefabricated substrate 02 may be disposed on the side of the second alignment layer 504 away from the first prefabricated substrate 01. A liquid crystal layer 60 may be disposed between the first prefabricated substrate 01 and the second prefabricated substrate 02, as shown in FIG. 34.

S46: at the positions of the first side surface 10C and the second side surface 10D of the first prefabricated substrate 01, cutting the second film layer 20 along the direction X parallel to the plane of the first film layer 10, such that the second portion 202, the third portion 203, and the first film layer 10 of the first prefabricated substrate 01 may be separated from the first portion 201 thereof, as shown in FIG. 35.

S47: at the positions of the first side surface 10C and the second side surface 10D of the second prefabricated substrate 02, cutting the second film layer 20 along the direction X parallel to the plane of the first film layer 10, such that the second portion 202, the third portion 203, and the first film layer 10 of the second prefabricated substrate 02 may be separated from the first portion 201 thereof, as shown in FIG. 35.

S48: obtaining the flexible module 0000, as shown in FIG. 36.

In one embodiment, in the fabrication method of the flexible module 0000 in the disclosed embodiments, the prefabricated substrate 00 in the above-disclosed embodiments may be used, and the flexible module 0000 in the disclosed embodiments may have a flexible dimming structure. It should be understood that the disclosed embodiments may merely illustrate the fabrication method of the flexible module 0000 having the flexible dimming structure using the prefabricated substrate 00 in the disclosed embodiments as an example, in specific implementation, the flexible module 0000 may be a flexible display panel or any other flexible product, which may not be limited by the present disclosure. The flexible dimming structure, also known as electronically controlled dimming film, may be the core material for forming dimming glass, and may be formed by combining liquid crystal and polymer materials between two transparent electrode layers. When the two transparent electrode layers are powered off, the liquid crystal may scatter the incident light and may be in an opaque state. When the two transparent electrode layers are powered on, the liquid crystal molecules may be arranged in an orderly manner along the direction of the electric field, and the liquid crystal may transmit the incident light and may be in a transparent state. The flexible dimming structure may often be pasted on the light-emitting surface of the display product, which may be applied to display products that need to achieve privacy protection.

In one embodiment, the flexible module 0000 formed by the disclosed fabrication method may include the first prefabricated substrate 01, the second prefabricated substrate 02, and the liquid crystal layer 60 located between the first prefabricated substrate 01 and the second prefabricated substrate 02. The first prefabricated substrate 01 and the second prefabricated substrate 02 may use the prefabricated substrate 00 in any one of the above-disclosed embodiments. First, the first electrode layer 501 and the first alignment layer 502 may be sequentially formed on the side of the first portion 201 of the first prefabricated substrate 01 away from the first film layer 10, such that the first electrode layer 501 may be disposed on the side of the first portion 201 of the first prefabricated substrate 01 away from the first film layer 10, and the first alignment layer 502 may be disposed on the side of the first electrode layer 501 away from the first prefabricated substrate 01. The first electrode layer 501 may be patterned, and the first electrode layer 501 may be made of a transparent conductive material such as indium tin oxide (ITO) or indium zinc oxide (IZO), etc. The alignment of the first alignment layer 502 may include a rubbing alignment process, etc. Similarly, the second electrode layer 503 and the second alignment layer 504 may be sequentially formed on the side of the first portion 201 of the second prefabricated substrate 02 away from the first film layer 10, such that the second electrode layer 503 may be disposed on the side of the first portion 201 of the second prefabricated substrate 02 away from the first film layer 10, and the second alignment layer 504 may be disposed on the side of the second electrode layer 503 away from the second prefabricated substrate 02. The second electrode layer 503 may be patterned, and the second electrode layer 503 may be made of a transparent conductive material such as ITO or IZO, etc. The alignment of the second alignment layer 504 may include a rubbing alignment process, etc.

In one embodiment, a thin film transistor array layer may be disposed on the side of the first prefabricated substrate 01 or the second prefabricated substrate 02 adjacent to the liquid crystal layer 60, which may be configured to provide a driving electric field between the first electrode layer 501 and the second electrode layer 502 in a local region, to achieve the dimming of the local region of the flexible module 0000. The first prefabricated substrate 01 including the first electrode layer 501 and the first alignment layer 502 and the second prefabricated substrate 02 including the second electrode layer 503 and the second alignment layer 504 may be fixed into a box. Therefore, the first prefabricated substrate 01 may be located on the side of the first alignment layer 502 away from the second prefabricated substrate 02, and the second prefabricated substrate 02 may be located on the side of the second alignment layer 504 away from the first prefabricated substrate 01. The liquid crystal layer 60 may be located between the first prefabricated substrate 01 and the second prefabricated substrate 02. In one embodiment, the first prefabricated substrate 01 and the second prefabricated substrate 02 may be fixed into a box through a sealant 70, and forming the liquid crystal layer 60 may include one of a liquid crystal filling method or a liquid crystal injection method, which may not be repeated herein.

After the structure of the flexible module 0000 is almost formed, the rigid first film layer 10 of the prefabricated substrate may be separated. At the positions of the first side surface 10C and the second side surface 10D of the first prefabricated substrates 01, the second film layer 20 may be cut along the direction X of the plane of the first film layer 10, such that the second portion 202, the third portion 203, and the first film layer 10 of the first prefabricated substrate 01 may be separated from the first portion 201 thereof. At the positions of the first side surface 10C and the second side surface 10D of the second prefabricated substrates 02, the second film layer 20 may be cut along the direction X parallel to the plane of the first film layer 10, such that the second portion 202, the third portion 203 and the first film layer 10 of the second prefabricated substrate 02 may be separated from the first portion 201 thereof. The above-disclosed method for separating the structure of the rigid first film layer 10 may be understood with reference to the fabrication method of the flexible substrate in the above-disclosed embodiments, which may not be repeated herein.

After the second portion 202, the third portion 203 and the first film layer 10 of the first prefabricated substrate 01 are separated from the first portion 201 thereof, and the second portion 202, the third portion 203 and the first film layer 10 of the second prefabricated substrate 02 are separated from the first portion 201, the flexible module 0000 in the disclosed embodiments may be obtained.

In one embodiment, the method for forming the flexible module 0000 by using the prefabricated substrate 00 may not only avoid warpage of the first prefabricated substrate 01 and the second prefabricated substrate 02 through the double-sided attachment effect of first film layer 10 and the second film layer 20, but also facilitate to resolve the peeling problem of the film layers of the flexible module 0000. In the process of peeling the first film layer 10 from the second film layer 20 after forming the any other structure of the flexible module 0000, the rigid film layer of the prefabricated substrate 00 may not need to be cut, such that the rigid first film layer 10 may be reused, which may not only reduce the cost, but also maximize the use of the large area of the first film layer 10 and the second film layer 20, may improve the production efficiency and save the cost while ensuring the production yield.

It should be noted that the disclosed embodiments may merely use the fabrication method of the flexible module 0000 using the prefabricated substrate 00 in the disclosed embodiments as an example, in specific implementation, the method may include but may not be limited to such fabrication method, and any other fabrication method may be used. The prefabricated substrate 00 may be used to form flexible modules with any other structure, for example, various film layer structures of flexible products may be formed over the rigid layer, and then the rigid layer may be removed to obtain the desired flexible module, which may not be limited herein.

Figure 37:
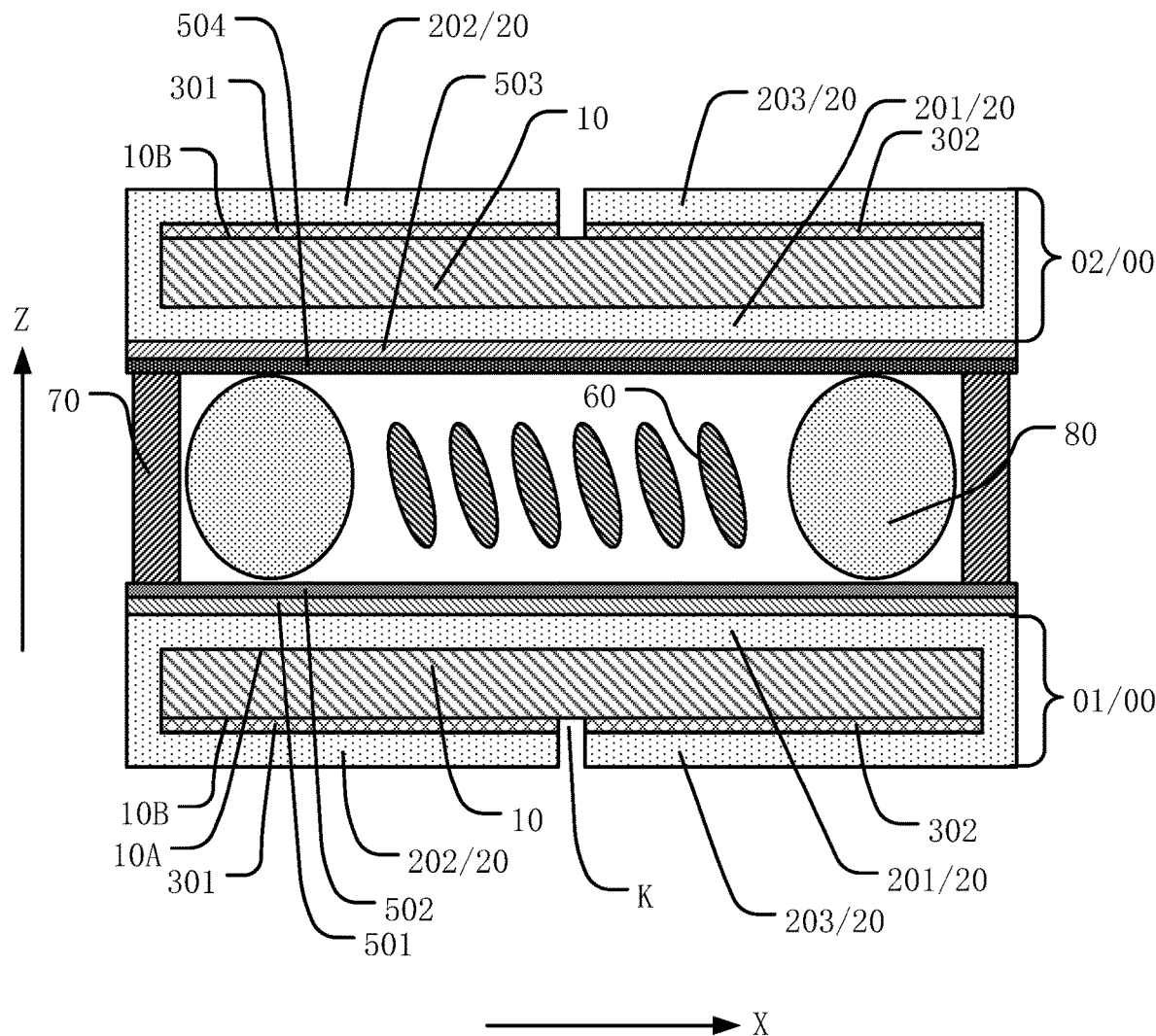
FIG. 37 illustrates another schematic diagram of a semiconductor structure corresponding to a stage of fixing the first prefabricated substrate and the second prefabricated substrate into a box in the fabrication method of the flexible module in FIG. 29 consistent with disclosed embodiments of the present disclosure.

FIG. 37 illustrates another schematic diagram of a semiconductor structure corresponding to a stage of fixing the first prefabricated substrate and the second prefabricated substrate into a box in the fabrication method in FIG. 29. Optionally, referring to FIGS. 29-35 and FIG. 37, in the fabrication method of the flexible module 0000, the first prefabricated substrate 01 and the second prefabricated substrate 02 may be fixed into a box. The method may further include disposing one or more spherical spacers 80 between the first prefabricated substrate 01 and the second prefabricated substrate 02. Because the rigid first film layer 10 in the ultimately formed flexible module 0000 needs to be removed, to obtain the first portion 201 of the flexible second film layer 20 as a flexible substrate. To ensure the overall stability of the flexible module 0000, the spherical spacer 80 may be disposed between the two flexible substrates. Multiple spherical spacers 80 may be disposed in the liquid crystal layer 60, and may abut between the first prefabricated substrate 01 and the second prefabricated substrate 02 for supporting and shaping to avoid deformation caused by distortion and extrusion, which may facilitate to improve the stability of the overall structure.

Figure 38:
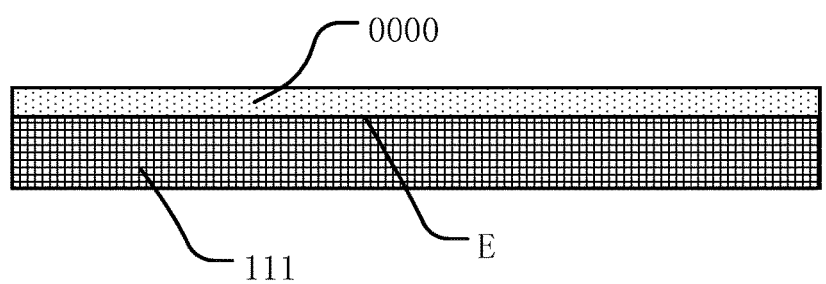
FIG. 38 illustrates a schematic diagram of an exemplary display device consistent with various disclosed embodiments of the present disclosure.

The present disclosure further provides a display device. FIG. 38 illustrates a schematic diagram of a display device consistent with various disclosed embodiments of the present disclosure. In certain embodiments, referring to FIG. 38, the display device 1111 may include a display panel 111 and a flexible module 0000. The flexible module 0000 may be attached on the side of a light-emitting surface E of the display panel 111. In one embodiment, the display panel 111 may be a liquid crystal display panel, an organic light-emitting diode display panel, or any other type of display panel. The flexible module 0000 may be used as a dimming structure and disposed on the side of the light-emitting surface E of the display panel 111. The flexible module 0000 may be formed by using the fabrication method in the above-disclosed embodiments. It should be understood that the display device 1111 may be a computer, a TV, a vehicle-mounted display device and any other display device 1111 having a display function, which may not be specifically limited by the present disclosure. The display device 1111 may have the beneficial effects of the flexible module 0000, and details may refer to corresponding descriptions of the flexible module 0000 in the above-disclosed embodiments, which may not be repeated herein.

The disclosed prefabricated substrate, flexible substrate, flexible module and fabrication method thereof, and the display device may include at least following beneficial effects. The prefabricated substrate may at least include the first film layer and the second film layer. The first film layer may be a rigid film layer, and the second film layer may be a flexible film layer. The second film layer may at least partially wrap the first film layer, such that the first film layer and the second film layer may have the double-sided attachment effect. In other words, the oppositely disposed first surface and second surface of the first film layer may be attached on the second film layer, even if the thermal expansion coefficient of the flexible material of the second film layer is greatly different from the thermal expansion coefficient of the rigid material of the first film layer, the warpage of the entire prefabricated substrate may be effectively suppressed. The peeling of any other film layer of the subsequently formed flexible module from the flexible second film layer of the prefabricated substrate may be effectively resolved, which may facilitate to improve the production yield of flexible modules.

In the disclosed embodiments, the second portion of the second film layer may be attached on the second surface through the first adhesive layer, and the third portion of the second film layer may be attached on the second surface through the second adhesive layer, thereby enhancing the stability of wrapping effect of the first film layer and the second film layer of the prefabricated substrate, and enhancing the bonding force between the first film layer and the second film layer, which may facilitate to suppress the warpage of the film layer.

In the direction parallel to the plane of the first film layer, along the direction pointing from the second portion to the third portion, the end of the second portion adjacent to the third portion and the end of the third portion adjacent to the second portion may be spaced apart by a gap. The gap may provide a cut-in point for peeling the second film layer from the first film layer after subsequently forming any other film layer structure of the flexible module on the first portion of the second film layer, and may prevent the second film layer from fully wrapping the first film layer without the cut-in point for peeling, which may reduce the difficulty of the subsequent peeling process and may improve the efficiency of the peeling process.

In the subsequent process of peeling the first film layer from the second film layer, the rigid film layer of the prefabricated substrate may not need to be cut, such that the rigid first film layer may be reused, which may not only reduce the cost, but also maximize the use of the large area of the first film layer and the second film layer. Therefore, the effective area of the formed flexible module may be large enough to avoid the problems of sacrificing the actual usable area of the second film layer caused by cutting the edge region of the prefabricated substrate, and the cost may be reduced while ensuring the production yield.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A prefabricated substrate, comprising:
a first film layer and a second film layer, wherein:
the first film layer is a rigid film layer, the second film layer is a flexible film layer, and the second film layer at least partially wraps the first film layer,
when the second film layer is flattened, the second film layer at least includes a first region, and a second region and a third region that are located on opposite sides of the first region,
the second film layer at least further includes a first portion, a second portion and a third portion, wherein the first portion is located in the first region, the second portion is located in the second region, and the third portion is located in the third region,
in a direction perpendicular to a plane of the first film layer, the first film layer includes a first surface and a second surface that are disposed opposite to each other, wherein the first portion is located on a side of the first surface away from the second surface, and the second portion and the third portion are located on a side of the second surface away from the first surface,
the second portion is attached on the second surface through a first adhesive layer, and the third portion is attached on the second surface through a second adhesive layer, and
in a direction parallel to the plane of the first film layer, along a direction pointing from the second portion to the third portion, an end of the second portion adjacent to the third portion and an end of the third portion adjacent to the second portion are spaced apart by a gap.

2. The prefabricated substrate according to claim 1, wherein:
in the direction perpendicular to the plane of the first film layer, a thickness of the first film layer is greater than a thickness of the second film layer.

3. The prefabricated substrate according to claim 1, wherein:
the first surface of the first film layer is in direct contact with the first portion of the second film layer.

4. The prefabricated substrate according to claim 1, further including:
a third film layer, disposed between the first film layer and the first portion of the second film layer, wherein the third film layer is a flexible film layer, is attached on the first portion of the second film layer through a third adhesive layer, and is in direct contact with the first surface of the first film layer.

5. The prefabricated substrate according to claim 4, wherein:
the second film layer further includes a fourth region and a fifth region, wherein when the second film layer is flattened, the fourth region is located between the first region and the second region, and the fifth region is located between the first region and the third region,
the second film layer further includes a fourth portion and a fifth portion, wherein the fourth portion is located in the fourth region, and the fifth portion is located in the fifth region,
the first film layer further includes a first side surface and a second side surface that are disposed opposite to each other, wherein the first side surface intersects with the first surface, and the second side surface intersects with the first surface, and
the fourth portion is attached on the first side surface of the first film layer through a fourth adhesive layer, and the fifth portion is attached on the second side surface of the first film layer through a fifth adhesive layer.

6. The prefabricated substrate according to claim 5, wherein:
the first adhesive layer, the second adhesive layer, the third adhesive layer, the fourth adhesive layer, and the fifth adhesive layer are integrally formed into one piece.

7. The prefabricated substrate according to claim 4, wherein:
in the direction perpendicular to the plane of the first film layer, a thickness of the third film layer is smaller than a thickness of the second film layer.

8. The prefabricated substrate according to claim 4, wherein:
an orthographic projection of the third film layer on the first portion of the second film layer is located within a range of the first portion.

9. The prefabricated substrate according to claim 8, wherein:
at least a portion of the third adhesive layer is disposed between the first portion of the second film layer and the first film layer.

10. A flexible substrate, comprising:
a prefabricated substrate according to claim 1.

* * * * *